United States Patent [19]
Hayashi et al.

[11] Patent Number: 5,440,260
[45] Date of Patent: Aug. 8, 1995

[54] VARIABLE DELAY CIRCUIT

[75] Inventors: Yokichi Hayashi, Ohra; Hiroshi Tsukahara; Katsumi Ochiai, both of Gyoda; Mashuhiro Yamada, Ashikaga; Naoyoshi Watanabe, Gyoda, all of Japan

[73] Assignee: Advantest Corporation, Tokyo, Japan

[21] Appl. No.: 253,216

[22] Filed: Jun. 2, 1994

Related U.S. Application Data

[62] Division of Ser. No. 924,520, Aug. 4, 1992, abandoned.

[30] Foreign Application Priority Data

| | | | |
|---|---|---|---|
| Aug. 14, 1991 | [JP] | Japan | 3-204365 |
| Nov. 8, 1991 | [JP] | Japan | 3-293230 |
| Nov. 8, 1991 | [JP] | Japan | 3-293231 |
| Nov. 8, 1991 | [JP] | Japan | 3-293232 |
| Nov. 8, 1991 | [JP] | Japan | 3-293233 |
| Nov. 29, 1991 | [JP] | Japan | 3-098755 U |

[51] Int. Cl.⁶ .................. H03K 5/13; H03K 19/091
[52] U.S. Cl. ..................... 327/278; 327/281
[58] Field of Search ............... 307/594, 597, 603, 605; 327/276, 278, 280, 281, 285

[56] References Cited

U.S. PATENT DOCUMENTS

| | | | |
|---|---|---|---|
| 5,012,142 | 4/1991 | Sonntag | 307/605 X |
| 5,051,630 | 9/1991 | Kogan et al. | 307/603 |
| 5,055,706 | 10/1991 | Nakai et al. | 307/603 X |
| 5,121,014 | 6/1992 | Huang | 307/605 |
| 5,164,621 | 11/1992 | Miyamoto | 307/603 X |

Primary Examiner—Willis R. Wolfe
Attorney, Agent, or Firm—Staas & Halsey

[57] ABSTRACT

The gate of a CMOS transistor formed by a series connection of p-channel and n-channel FETs 21 and 22 is connected to an input terminal 23, and the drain of the CMOS transistor is connected to an output terminal 24. The source of the FET 21 is connected to a positive power supply terminal 20 via parallel-connected switchable resistance elements $37_0$, $37_1$, $37_2$, . . formed by p-channel FETs and having resistance values $R_0$, $R_1$, $R_2$, . . . , respectively. The source of the other FET 22 is connected to a negative power supply terminal 30 via parallel-connected switchable resistance elements $38_0$, $38_1$, $38_2$, . . . formed by n-channel FETs and having resistance values $R_0$, $R_1$, $R_2$, . . . , respectively. Delay setting signals $S_0$, $S_1$, . . . are decoded by a decoder 39 and one of more of its output terminals $Y_0$, $Y_1$, . . . go to the high level. The output terminals $Y_0$, $Y_1$, $Y_2$, . . . are connected directly to the gates of the FETs forming the resistance elements $38_0$, $38_1$, $38_2$, . . . , respectively, and are connected to the gates of the FETs of the resistance elements $37_0$, $37_1$, $37_2$, . . . via inverters. The time constant of the charge and discharge for a load capacitance at the output terminal 24 differs with combinations of two resistance elements which are simultaneously turned ON, changing a delay of the input signal accordingly.

2 Claims, 18 Drawing Sheets

TABLE I

FIG. 15 TABLE II

| | SEL₂ | SEL₁ | WAVEFORM AT CP | WAVEFORM AT 24 |
|---|---|---|---|---|
| A | H | H | | |
| B | H | L | | ΔT |
| C | L | H | | 2ΔT |
| D | L | L | | 3ΔT |

FIG. 20B TABLE III $r_1 \cong r_2$

| | | SW1 | |
|---|---|---|---|
| | | OFF | ON |
| SW2 | OFF | HIGH OUTPUT IMPEDANCE | $\tau = r_1 \cdot C_L$ |
| | ON | — | $\tau = \dfrac{r_1}{2} \cdot C_L$ |

FIG. 20C TABLE IV $r_1 < r_2$

| | | SW1 | |
|---|---|---|---|
| | | OFF | ON |
| SW2 | OFF | HIGH OUTPUT IMPEDANCE | $\tau = r_1 \cdot C_L$ |
| | ON | $\tau = r_2 \cdot C_L$ | $\tau = \dfrac{r_1 \cdot r_2}{r_1 + r_2} \cdot C_L$ |

VARIABLE DELAY CIRCUIT

This application is a division of application Ser. No. 07/924,520, filed Aug. 4, 1992, now abandoned.

BACKGROUND OF THE INVENTION

The present invention relates to a fine variable delay circuit which is suitable for use as each of variable delay stages which are cascade-connected to form a variable delay circuit which is able to delay, for example, an input signal thereto for a desired period of time.

Generally speaking, CMOS logic circuits individually have inherent input-output delay times of their own depending on various conditions during manufacture. As compared with logic circuits formed by bipolar transistors, the CMOS circuits suffer their larger scattering delay time, and therefore, the use of such CMOS logic circuits for forming various circuits will lead to lack of a timing margin. A fine variable delay circuit is needed to correct variations in the input-output delay time of such a CMOS logic circuit.

FIG. 1A shows a conventional variable delay circuit formed by a plurality of cascade-connected variable delay stages to which the present invention is applicable. Variable delay stages 11, 12 and 13 are connected in series and the delay time of each stage is selectively variable by selecting one of two paths branched from its input under control of a multiplexer 14. In this example, the variable delay stage 11 has buffers 15 and 16 respectively provided in two paths, the variable delay stage 12 has one buffer 16 provided in only one of the two paths and the variable delay stage 13 has two series-connected buffers 16 provided in only one of the two paths. The propagation delay time Tpd of the buffer 16 is set to a value twice larger than the propagation delay time Tpd of the buffer 15. For instance, the buffer 15 may be formed by a series connection of two inverters, whereas the buffer 16 by a series connection of four inverters. By selective control of select signals $SEL_1$, $SEL_2$ and $SEL_3$ for the multiplexers 14 of the respective variable delay stages 11, 12 and 13, the path between an input terminal 17 and an output terminal 18 is changed for each stage, whereby delay times 1, 2, ..., 8 times as long as the propagation delay time Tpd of the buffer 15, respectively, are provided in this example.

In the case where a delay element 19 is provided in only one of the two paths in each of the variable delay stages 11, 12 and 13 as shown in FIG. 1B, the delays $d_1$, $d_2$ and $d_3$ of the delay elements 19 are A, 2A and 4A, respectively, where A is a minimum resolution desired to obtain. In the case of n variable delay stages being connected, the delay $d_n$ of the delay element 19 in the nth stage is $A2^{n-1}$.

With the prior art example depicted in FIG. 1A, it is difficult to raise or improve the resolution (i.e. to reduce the minimum variable step) partly because the delays of the buffers 15 and 16 are relatively large, for example, 200 to 500 pS and partly because the total propagation delay between the input and output terminals 17 and 18 consists in great part of a fixed delay. In other words, since the scattering of the delays of the buffers has an appreciable influence on the total propagation delay as a whole, it is difficult to raise the delay resolution within compensated scattering delay. In the case where the buffers 15 and 16 are fabricated as integrated circuits using CMOS's, the scattering of their delays is particularly large, making it more difficult to increase the resolution than in the case where bipolar transistors are used to form the buffers 15 and 16.

The circuit arrangement shown in FIG. 1B also utilizes the propagation delay of each delay element 19, which scatters due to varying conditions during manufacture, variations in the power supply voltage and ambient temperature and the scatter of the line capacity as well. Letting the delay resolution, i.e. the minimum variable step be represented by A, it is possible, ideally, that the nth variable delay stage selects the delay 0 or $A2^{n-1}$ and that the delays ranging from 0 to $A2^{n-1}$ are selectively set every step A at will by the variable delay circuit formed by a total of M variable delay stages. Accordingly, the following equation holds:

$$A2^{n-1} = A(2^0 + 2^1 + \ldots + 2^{n-2}) + A2^0.$$

In practice, however, the delays of the respective delay stages scatter. Now, let the scattering or dispersion ratio of delay in each delay element be represented by $\alpha$. In the worst case, there are the possibilities that the sum of delays in variable delay stages preceding a certain stage becomes minimum due to scattering and that the delay in that certain stage becomes maximum due to scattering, and even in such a case, the required delay resolution A must be secured. In the actual design of the variable delay circuit it is necessary, therefore, to predetermine the delays $d_1$, $d_2$, ... of respective delay stages in anticipation of their scattering. That is, the delay $d_1$, which satisfies $(1+\alpha)d_1 = A$, is determined for the first delay stage 11; the delay $d_2$, which satisfies $(1+\alpha)d_2 = d_1(1-\alpha) + A$, and hence is equal to $2A/(1+\alpha)^2$, is determined for the second delay stage 12; and the delay $d_3$, which satisfies $(1+\alpha)d_3 = (d_1+d_2)(1-\alpha)$, and hence is equal to $2A/(1+\alpha)^3$, is determined for the third delay stage 13. In the case where n delay stages are connected in cascade, the delay of the nth stage is $D_n = 2^{n-1} \cdot A/(1+\alpha)^n$, taking the scatter of the delay into account.

Thus the influence of the delay scattering or dispersion ratio $\alpha$ increases as the last delay stage is approached and the delay becomes smaller than that $d_n = 2^{n-1} \cdot A$ in the ideal case, making it impossible to enlarge the range over which the delay of each delay stage is variable. In the case of using a CMOS gate array to form the delay element, the ratio $\alpha$ is usually around 0.6, and since this is an appreciably large value, the circuit which provides the desired delay would become inevitably large-scale, and hence is impractical.

SUMMARY OF THE INVENTION

It is therefore an object of the present invention to provide a fine variable delay circuit whose delay does not largely scatter and can be varied with a relatively small step.

According to a first aspect of the present invention, first and second transistors of different conductivity types are connected at one end to each other, the connection point is connected to an output terminal and both input ends of the first and second transistors are connected together to an input terminal. At least two switchable first resistance elements of different resistance values are connected in parallel between the other end of the first transistor and one end of the power supply, and at least two switchable second resistance elements of different resistance values are similarly connected in parallel between the other end of the second transistor and the other end of the power supply.

At least one of the first resistance elements and at least one of the second resistance elements are selectively set to the ON state by delay setting means.

According to a second aspect of the present invention, a first FET of the same conductivity type as that of one of two FETs forming a CMOS transistor is connected between one end of the CMOS transistor and one end of the power supply, a second FET of the same conductivity type as that of the other FET forming the CMOS transistor is connected between the other end of the CMOS transistor and the other end of the power supply, and a third FET of the same conductivity type as that of the first FET is connected between the connection point of the CMOS transistor and the first FET and the other end of the power supply. The connection point of the other end of the CMOS transistor and the second FET is connected to one end of the power supply via a fourth FET of the same conductivity type as that of the second FET. A first switch is connected in series to the third FET and a second switch is connected in series to the fourth FET. Delay setting means is provided for simultaneously setting the first and second switches to the ON or OFF state.

According to a third aspect of the present invention, first and second transistors of different conductivity types are connected at one end to each other and have their input ends connected to a common input terminal, and the connection point of the first and second transistors is connected to an output terminal via an inverter. A third transistor is connected in series to the series connection of the first and second transistors between it and the power supply, and a variable DC power supply is connected to an input terminal of the third transistor.

According to a fourth aspect of the present invention, an input signal is supplied to a buffer, which has an output impedance and outputs a logical level, and the output is provided to a schmidt trigger buffer. A CMOS transistor is connected at the input side to the connection point of the both buffers and connected at both ends to the power supply and the ground via first and second switching elements, respectively. The first and second switching elements are simultaneously controlled by a select signal.

According to a fifth aspect of the present invention, a fine variable delay circuit is constituted by connecting a load capacitance between the output of a buffer formed by a CMOS logic circuit and the ground via a complementary analog switch having a p-channel MOSFET and an n-channel MOSFET interconnected between their source and drain.

According to a sixth aspect of the present invention, a series-parallel circuit formed by a parallel connection of a plurality of series circuit, each having a CMOS type transmission gate connected to the output side of a CMOS buffer circuit, is connected between input and output terminals. By selectively turning ON and OFF the plurality of transmission gates, the delay time between the input and output terminals for a load capacitance connected to the output terminal is varied.

According to a seventh aspect of the present invention, first and second exclusive-OR gates are used, which are connected at one input side to a common delay input terminal. The other input side of the first exclusive-OR gate is grounded and a capacitor is connected between the output side of the first exclusive-OR gate and the output side of the second exclusive-OR gate. The other input side of the second exclusive-OR gate is connected to a select signal input terminal, the input side of a buffer, which outputs a logical level, is connected to the output side of the first exclusive-OR gate, and the output side of the buffer is connected to a delay output terminal.

BRIEF DESCRIPTION OF THE DRAWINGS

FIG. 15 is a table showing, by way of example, the relationships between the state of the select signal and waveforms appearing at a connection point CP and an output terminal 24;

FIG. 20B is a table showing a time constant $\tau$ between input and output terminals with respect to a load capacitance $C_L$ when $r_1=r_2$ in FIG. 20A;

FIG. 20C is a table showing the time constant $\tau$ between input and output terminals with respect to the load capacitance $C_L$ when $r_1>r_2$ in FIG. 20A;

DESCRIPTION OF THE PREFERRED EMBODIMENT

Figure 2:
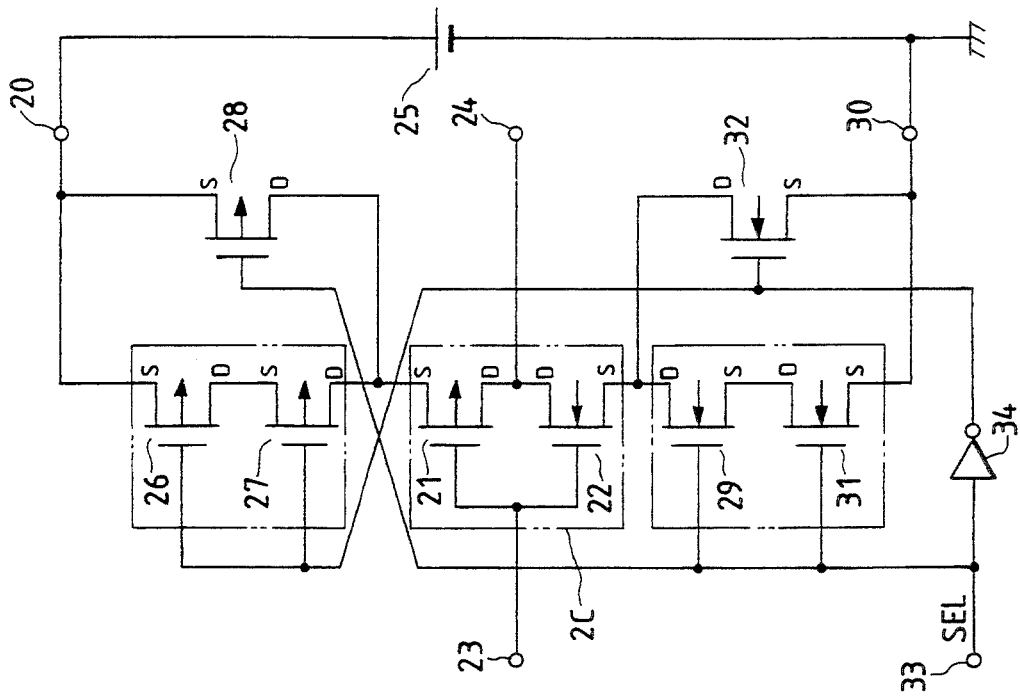
FIG. 2 is a circuit connection diagram illustrating an embodiment of the fine variable delay circuit according to the present invention.

FIG. 2 illustrates an embodiment according to the first aspect of the present invention, which employs MOSFETs as transistors. A first transistor is a p-channel FET 21 and a second transistor an n-channel FET 22. The FETs 21 and 22 have their input ends, i.e. their gates connected together to an input terminal 23 and their drains interconnected, and their connection point is connected to an output terminal 24. That is, the FETs 21 and 22 constitute one CMOS transistor 2C. While in the following various embodiments of the fine variable delay circuit according to the present invention the source and drain of each FET are specified so as to facilitate a better understanding of their operation, the same operation as that described below will be obtained even if the source and drain of the FET are exchanged.

A series circuit of p-channel FETs 26 and 27 is connected between the source of the FET 21 and a power supply terminal 20 which is to be connected to the positive side of a power supply 25, and a p-channel FET 28 is connected in parallel to the series circuit. Similarly, a series circuit of n-channel FETs 29 and 31 is connected between the source of the FET 22 and a power supply terminal 30 which is to be connected to the negative side of the power supply 25, and an n-channel FET 32 is connected in parallel to the series circuit. The FETs 28, 29 and 31 have their gates connected to a select terminal 33, which is, in turn, connected via an inverter 34 to gates of the FETs 26, 27 and 32. In this embodiment the FETs 21, 22, 26 to 29, 31 and 32 are of the same ON resistance, but they may also be of different ON resistances.

With the above-mentioned arrangement, when a select signal SEL at the select terminal 33 is low-level, the FETs 26, 27, 29 and 31 are OFF and the FETs 28 and 32 are ON. Letting the ON resistance of the FET be represented by r and a load capacitance present at the output terminal 24 (the sum of a stray capacitance at the terminal 24 and, for example, an input capacitance of the succeeding delay circuit which is connected to the terminal 24, not shown) by C, the circuit of FIG. 2 will become such an equivalent circuit as shown in FIG. 3A when the select signal SEL is low-level.

Figure 3B:
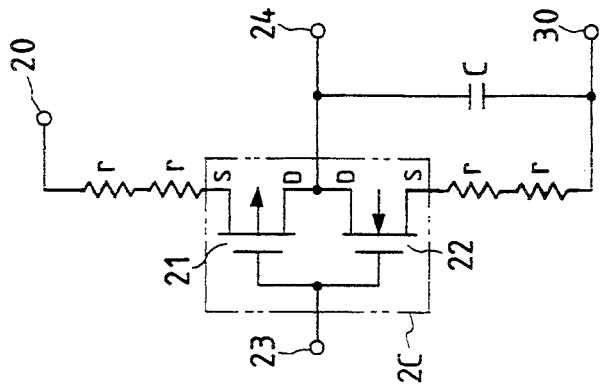
FIG. 3B is a circuit diagram showing an equivalent circuit of the FIG. 2 circuit when supplied with a high-level select signal.
Figure 3A:
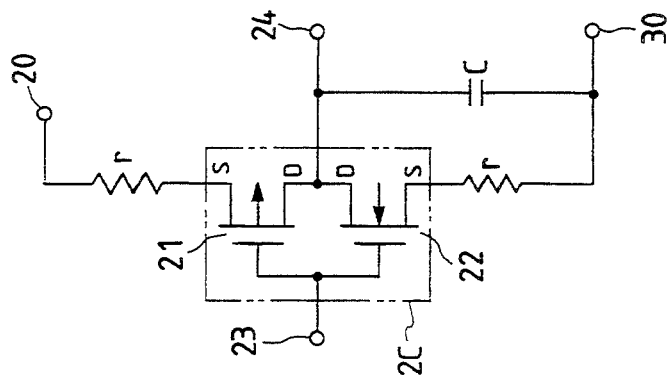
FIG. 3A is a circuit diagram showing an equivalent circuit of the FIG. 2 circuit when supplied with a low-level select signal.

When the select signal SEL at the terminal 33 is high-level, the FETs 26, 27, 29 and 31 are ON and the FETs 28 and 32 are OFF, in which case the circuit of FIG. 2 will become such an equivalent circuit as depicted in FIG. 3B. When the select signal SEL is low-level, the sources of the FETs 21 and 22 are connected to the power supply terminals 20 and 30 via one FET in the ON state. When the select signal SEL is high-level, the sources of the FETs 21 and 22 are connected to the power supply terminals 20 and 30 via a series circuit of two FETs in the ON state.

When an input signal at the input terminal 23 is low-level, the FET 21 is turned ON and the FET 22 OFF, and a current flows from the power supply terminal 20 to the output terminal 24 via the FETs 26 and 27 or the FET 28, depending on whether the select signal SEL is high-level or low-level. When the input signal is high-level, the FET 21 is turned OFF and the FET 22 ON, and a current flows from the output terminal 24 to the power supply terminal 30 via the FETs 29 and 31 or the FET 32, depending on whether the select signal SEL is high-level or low-level.

Figure 4A:
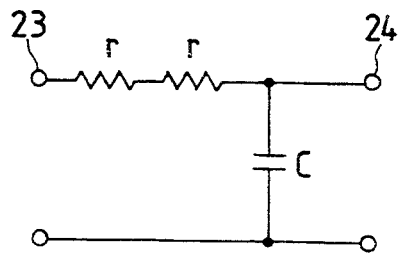
FIG. 4A is a circuit diagram showing an equivalent circuit of the FIG. 2 circuit when supplied with an input signal when the select signal is low-level.
Figure 4B:
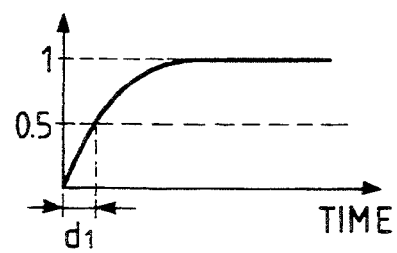
FIG. 4B is a diagram showing a step pulse response of the equivalent circuit shown in FIG. 4A.

Consequently, in the case where the select signal SEL is low-level, when an input signal is applied, the equivalent circuit enters such a state as shown in FIG. 4A wherein two ON resistances r (ON resistances of the FETs 21 and 28 or 22 and 32) are connected in series between the input terminal 23 and the output terminal 24. Applying a step pulse to the input terminal 23, the output at the output terminal 24 rises up in an exponential function curve with a time constant $(r+r)C$ as shown in FIG. 4B.

Figure 4C:
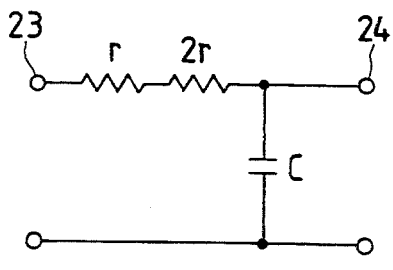
FIG. 4C is a circuit diagram showing an equivalent circuit of the FIG. 2 circuit when supplied with an input signal when the select signal is high-level.
Figure 4D:
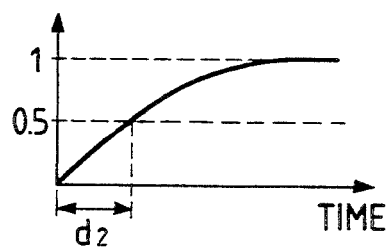
FIG. 4D is a diagram showing a step pulse response of the equivalent circuit shown in FIG. 4C.

On the other hand, in the case where the select signal SEL is high-level, when the input signal is applied, the equivalent circuit enters such a state as shown in FIG. 4C wherein three ON resistances r are connected in series between the input terminal 23 and the output terminal 24. Applying a step pulse to the input terminal 23, the output at the output terminal 24 rises up in an exponential function curve with a time constant $(r+2r)C$ as depicted in FIG. 4D. In this instance, the output rises up more slowly than in the case of FIG. 4A.

Now, let the time constant be represented by r and let it be assumed that half 0.5 of the level 1 at which the output reaches the maximum value is a threshold level. The time for the output to reach the threshold level from $1-\exp(-t/\tau)=0$ is $d_1=0.69\tau=0.69C(r+r)$ in the case of FIG. 4A and $d_2=0.69C(2r+r)$ in the case of FIG. 4C. Assuming, for example, that the ON resistance of the FET is $r=200\ \Omega$ and that the load capacitance is $C=0.1$ pF, $d_1=28$ pS and $d_2=56$ pS. Since the scatter of the ON resistance of the FET is small, the scatter of delays thus obtained is also small. Since different slight delay times $d_1$ and $d_2$ can be selected according to the level of the select signal as mentioned above, it is possible to constitute a variable delay circuit of a small minimum variable step by suitably selecting the numbers of FETs which are connected between the FETs 21, 22 and the power supply terminals 20, 30, respectively, and by applying the delay stage of FIG. 2 to each of the variable delay stages 11, 12 and 13.

Figure 5:
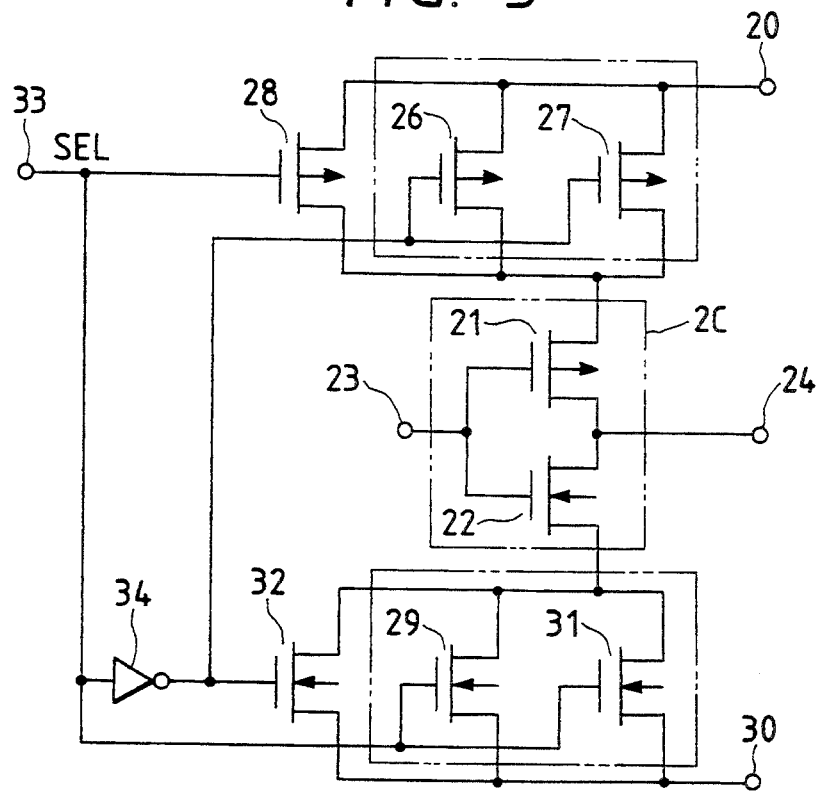
FIG. 5 is a circuit connection diagram illustrating another embodiment of the present invention.

FIG. 5 illustrates a modified form of the fine variable delay circuit depicted in FIG. 2, in which the FETs 26 and 27 are connected in parallel and the FETs 29 and 31 are also connected in parallel. In this instance, when the select signal SEL is high-level, two ON resistances r are connected in parallel between the FETs 21, 22 and the power supply terminals 20, 30, respectively, and consequently, the delay is smaller than in the case of FIG. 2.

Both of the embodiments shown in FIGS. 2 and 5 need to be constructed so that FETs of the same number are turned ON by the low level of the select signal SEL between the FETs 21, 22 and the power supply terminals 20, 30, respectively, and FETs of the same number but different from the above are turned ON by the high level of the select signal SEL. These numbers of FETs are not limited specifically to one and two. For example, by modifying the FIG. 2 embodiment to have a construction wherein one or more p-channel FETs are connected in parallel to the FET 28 and have their gates connected to the gate of the FET 28 and one or more n-channel FETs are connected in parallel to the FET 32 and have their gates connected to the gate of the FET 32, though not shown, it is possible to make the minimum variable delay step shorter.

In the FIG. 2 embodiment the series-connected p-channel FETs 26 and 27 may be substituted with one p-channel FET which has an ON resistance nearly equal to the sum of their ON resistances, and the series-connected n-channel FETs 29 and 31 may similarly be replaced with one n-channel FET which has an ON resistance nearly equal to the sum of their ON resistances. Likewise, it is possible, in the FIG. 5 embodiment, to substitute the parallel-connected p-channel FETs 26 and 27 with one p-channel FET which has an ON resistance nearly equal to a parallel resistance value of their ON resistances and the parallel-connected n-channel FETs with one n-channel FET which has an ON resistance substantially equal to a parallel resistance value of their ON resistances. It will easily be understood that in either case different delays are obtained according to the level of the select signal SEL as is the case with the above-described embodiments.

In FIG. 2, the FET 28 and the series-connected FETs 26, 27 respectively form switchable resistance elements of different resistance values, and the FET 32 and the series-connected FETs 29, 31 respectively form switchable resistance elements of different resistance values. Also in FIG. 5, the FET 28 and the parallel-connected FETs 26, 27 respectively form switchable resistance elements of different resistance values, and the FET 32 and the parallel-connected FETs 29, 31 respectively form switchable resistance elements of different resistance values.

While in the above embodiments two switchable resistance elements of different resistance values are connected in parallel between each end of the CMOS transistor 2C formed by a combination of the transistors 21 and 22 and one of the both power supply terminals 20 and 30, it is possible, in general, to select various delays by providing a plurality of parallel-connected switchable resistance elements of different resistance values.

Figure 6A:
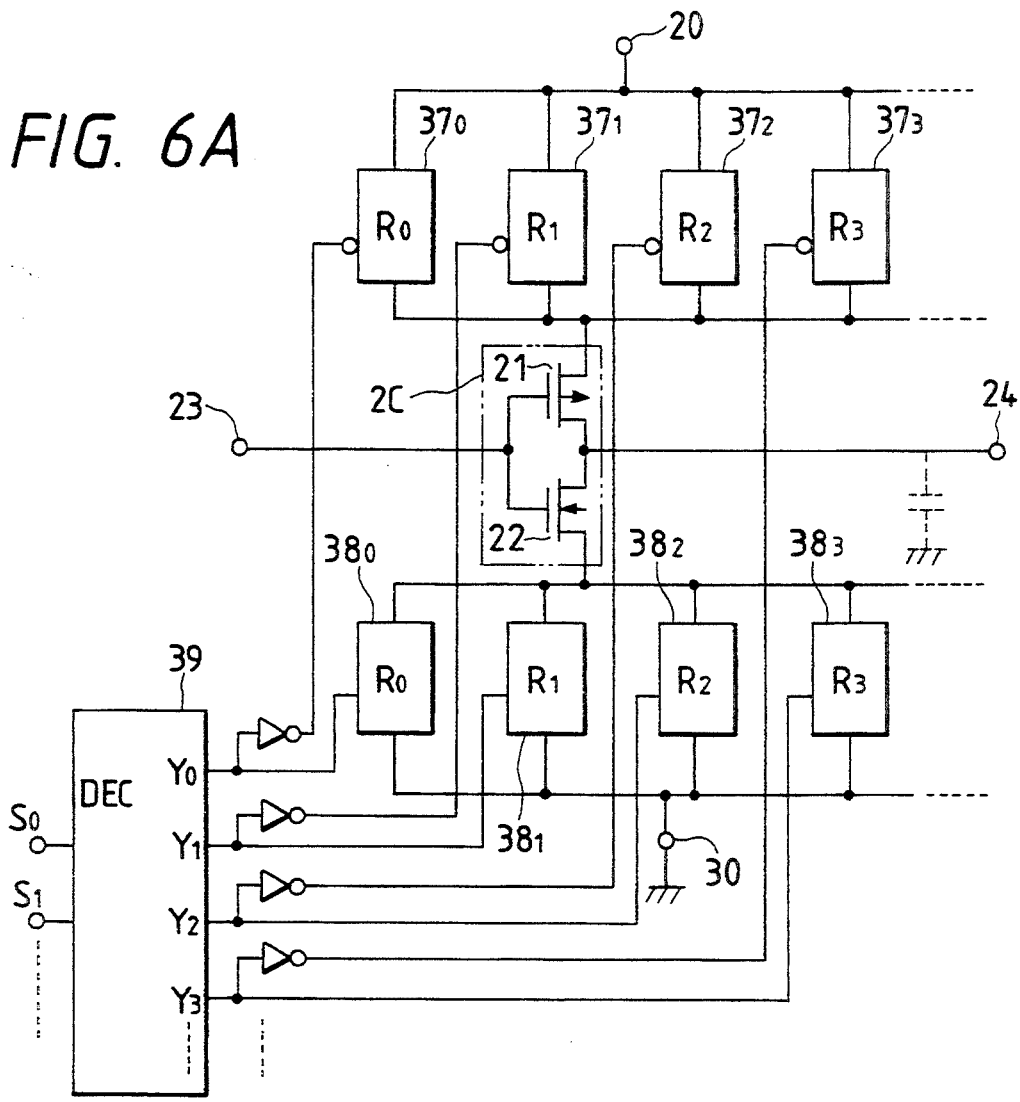
FIG. 6A is a connection diagram showing a general embodiment of the present invention.

That is, as shown in FIG. 6A, a plurality of switchable resistance elements $37_0$, $37_1$, $37_2$, ... of different resistance values are connected in parallel between one end of the series connection of the FETs 21 and 22 forming the CMOS transistor 2C, that is, between the FET 21 and the positive power supply terminal 20. Moreover, switchable resistance elements $38_0$, $38_1$, $38_2$, ... of different resistance values are connected in parallel between the FET 22 and the negative power supply terminal 30.

In this example the resistance elements $37_0$, $37_1$, $37_2$, ... are shown to be formed by p-channel FETs and the resistance elements $38_0$, $38_1$, $38_2$, ... are shown to be formed by n-channel FETs. The corresponding resistance elements connected between the FET 21 and the power supply terminal 20 and between the FET 22 and the power supply terminal 30, that is, the resistance elements $37_0$ and $38_0$, $37_1$ and $38_1$, $37_2$ and $38_2$, ... have the same resistance values $R_0$, $R_1$, $R_2$, ..., respectively, as shown in FIG. 6A.

Figure 6B:
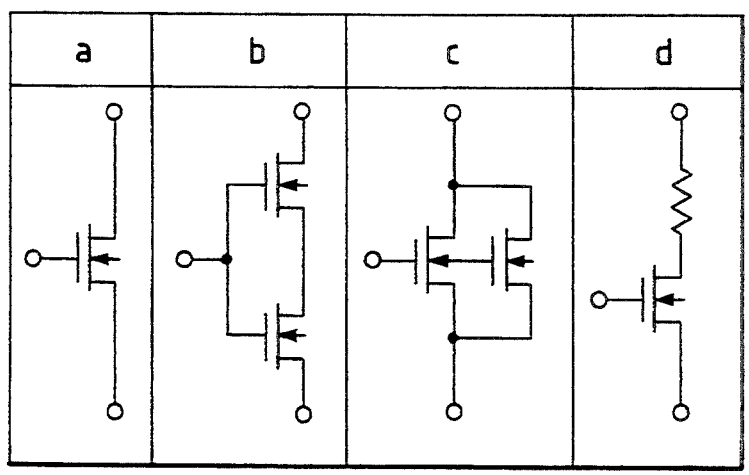
FIG. 6B is a connection diagram showing an example of each of resistance elements $38_0$, $38_1$, $38_2$, . . . in the FIG. 6A embodiment.

The resistance elements, for example $38_0$, $38_1$, $38_2$, ..., each formed by an n-channel FET, are each constituted by one n-channel FET as shown in column a of Table I in FIG. 6B, a series connection of two n-channel FETs as shown in column b, a series connection of more than two n-channel FETs (not shown in Table I), a parallel connection of two n-channel FETs as shown in column c, a parallel connection of more than two n-channel FETs (not shown), or a series connection of one n-channel FET and a passive resistance element of varying resistance value as shown in column d. Also in the case where the resistance element is formed by one FET, it is possible to employ a construction in which its ON resistance varies, as referred to previously. The same is true of the resistance elements $37_0$, $37_1$, $37_2$, ... each formed by a p-channel FET.

Delay setting signals $S_0$, $S_1$, $S_2$, ... are applied to a decoder 39 serving as delay setting means, wherein they are decoded, and outputs at one or more its output terminals $Y_0$, $Y_1$, $Y_2$, ... go high and the outputs at the other output terminals go low. The output terminals $Y_0$, $Y_1$, $Y_2$, ... are connected directly to gates of n-channel FETs forming the resistance elements $38_0$, $38_1$, $38_2$, ..., respectively, and at the same time, they are connected via inverters to gates of p-channel FETs forming the resistance elements $37_0$, $37_1$, $37_2$, ..., respectively.

With such an arrangement, for example, when the output at the output terminal $Y_0$ of the decoder 39 goes high, the resistance elements $37_0$ and $38_0$ are turned ON at the same time, while the other resistance elements remain OFF. When the output at the output terminal $Y_1$ goes high, the resistance elements $37_1$ and $38_1$ are turned ON at the same time, while the other resistance elements remain OFF. In this way, one or more of the resistance elements $37_0$, $37_1$, $37_2$, ... and one or more of the resistance elements $38_0$, $38_1$, $38_2$, ... corresponding to them (i.e. having the same resistance values as those of them) are simultaneously turned ON by the delay setting signals. Thus, by the same operation as described previously with reference to FIG. 2, the time for propagation of the input signal from the input terminal 23 to the output terminal 24 varies with the resistance value of the resistance element which is turned ON, and hence various delays can be set by the state of the delay setting signals $S_0$, $S_1$, . . . .

As described above, according to the first aspect of the present invention, a plurality of switchable resistance elements of different resistance values are used and they are selectively turned ON to change the charging rate of the load capacitance to thereby change the delay. In this case, the ON resistance of the transistor is utilized as the resistance, and this makes it particularly easy to obtain ON resistances of the same value when the circuit of the present invention is fabricated as an integrated circuit. Accordingly, the ON resistance value can be incremented or decremented by a fixed value with an appreciably high degree of accuracy, and hence the delay can be varied linearly, providing for enhanced resolution.

In the case where a number of pairs of resistance elements are provided to form one delay circuit as shown in FIG. 6A, a particularly large number of delays can be set. By using such a delay circuit as one stage of a multistage delay circuit, many delays can be set with a small number of delay stages, in which case fixed delays decrease accordingly, making it possible to form a high-resolution variable delay circuit whose delays do not largely scatter.

Figure 7:
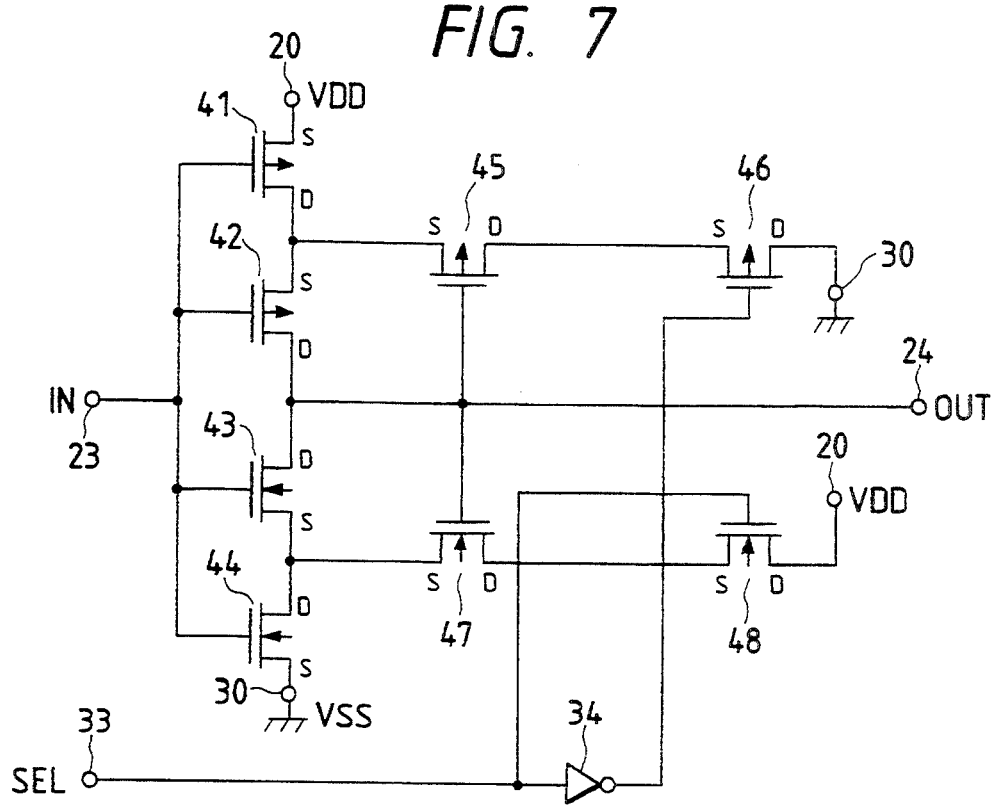
FIG. 7 is a circuit diagram illustrating another embodiment of the present invention.

FIG. 7 illustrates an embodiment of the fine variable delay circuit according to the second aspect of the present invention. This embodiment includes a first pair of p-channel MOSFETs 41 and 42 which have their drain and source interconnected, a second pair of n-channel MOSFETs 43 and 44 which have their source and drain interconnected, a third pair of p-channel MOSFETs 45 and 46 which have their drain and source interconnected, and a fourth pair of n-channel MOSFETs 47 and 48 which have their drain and source interconnected. The p-channel MOSFET 42 and the n-channel MOSFET 43 have their drains interconnected and have their gates interconnected to form a CMOS transistor, and the connection point of the gates is connected to the input terminal 23. The FETs 41 and 44 also have their gates connected to the input terminal 23. The connection point of the drains of the FETs 42 and 43 is connected to the output terminal 24. The source of the FET 41 is connected to a voltage source VDD via the terminal 20 and the source of the FET 44 is grounded via the terminal 30. The source of the FET 45 is connected to the connection point of the drain of the FET 41 and the source of the FET 42, and the drain of the FET 46 is grounded at the terminal 30. The source of the FET 47 is connected to the connection point of the source of the FET 43 and the drain of the FET 44, and the drain of the FET 48 is connected to the voltage source VDD at the terminal 20. The FETs 45 and 47 have their gates connected to the output terminal 24. The select signal SEL is provided via the inverter 34 to the gate of the FET 46 and is provided directly to the FET 48, turning them ON or OFF at the same time.

Figure 8A:
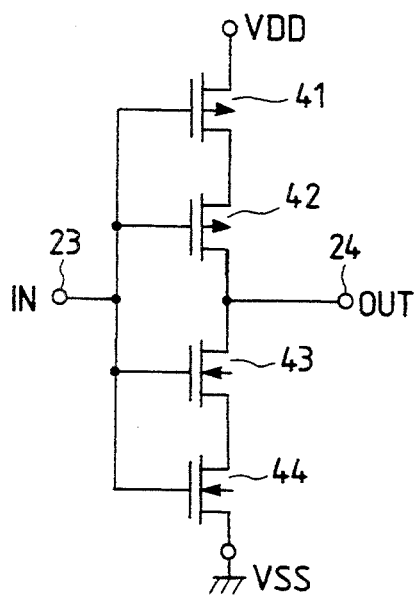
FIG. 8A is a circuit diagram showing an equivalent circuit of the FIG. 7 embodiment when the select signal is low-level.

A description will be given first of the case where the select signal SEL is at the low level. In this instance, the select signal SEL=0 is inverted by the inverter 34 (to go to the 1 level) and is then applied to the gate of the p-channel MOSFET 46 to turn it OFF, and at the same time, the select signal SEL=0 is applied intact to the gate of the n-channel MOSFET 48 to turn it OFF. As a result, the drains of the p-channel MOSFET 45 and the n-channel MOSFET 47 are open-circuited and these FETs 45 and 47 enter a state equivalent to that in which they are not connected. Consequently, when the select signal SEL is at the 0 level, the equivalent circuit of the FIG. 7 circuit is such as shown in FIG. 8A. This is a CMOS inverter circuit. The input and output potentials of the CMOS inverter circuit bear such relationships as depicted in FIG. 9A.

Figure 9B:
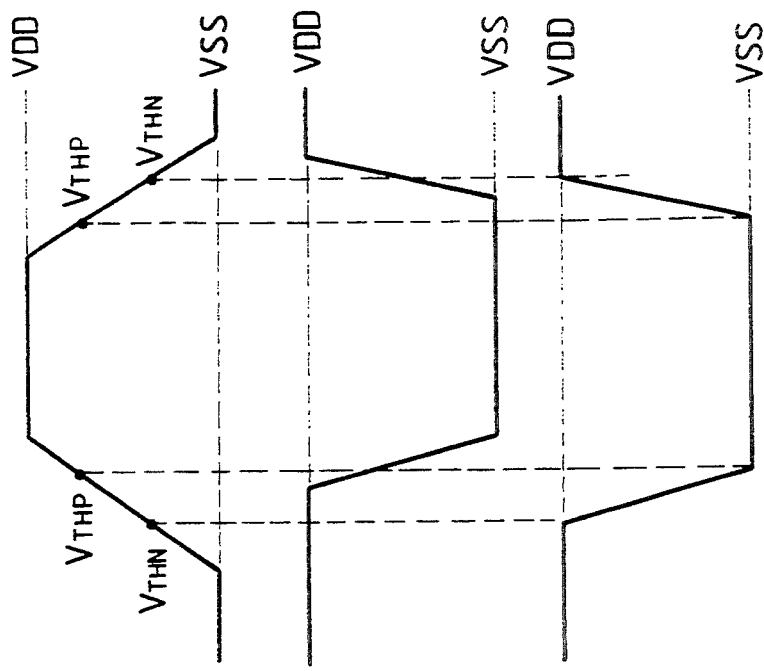
FIG. 9B is a waveform diagram for explaining a delay operation in the case of FIG. 8B.
Figure 9A:
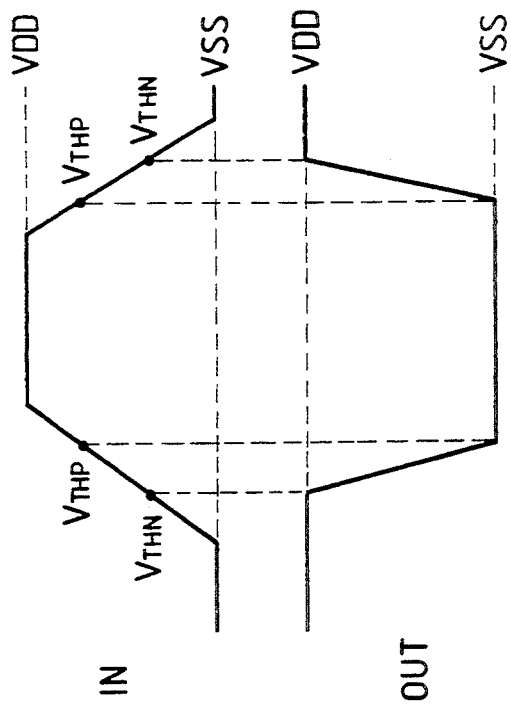
FIG. 9A is a waveform diagram for explaining a delay operation in the case of FIG. 8A.

In FIG. 9A, $V_{THN}$ is a gate-source voltage of an n-channel MOSFET at which its drain current starts to flow, and $V_{THP}$ is a gate-source voltage of a p-channel MOSFET at which its drain current starts to flow. When the input IN is lower in level than the gate-source voltage $V_{THN}$, the p-channel MOSFETs 41 and 42 are both turned ON and the n-channel MOSFETs 43 and 44 are turned OFF, with the result that the output OUT becomes the power source voltage VDD. When the input IN is higher than $V_{THP}$, the p-channel MOSFETs 41 and 42 are both turned OFF and the n-channel MOSFETs 43 and 44 are turned ON, with the result that the output OUT becomes a ground voltage VSS. When the input IN is intermediate between $V_{THP}$ and $V_{THN}$, a voltage corresponding to the voltage dividing ratio of the ON resistances of the FETs 41 through 44 is output. Similarly, when the input IN falls from VDD to VSS, the output OUT rises up from VSS to VDD as the level of the input IN varies from $V_{THP}$ to $V_{THN}$.

Figure 8B:
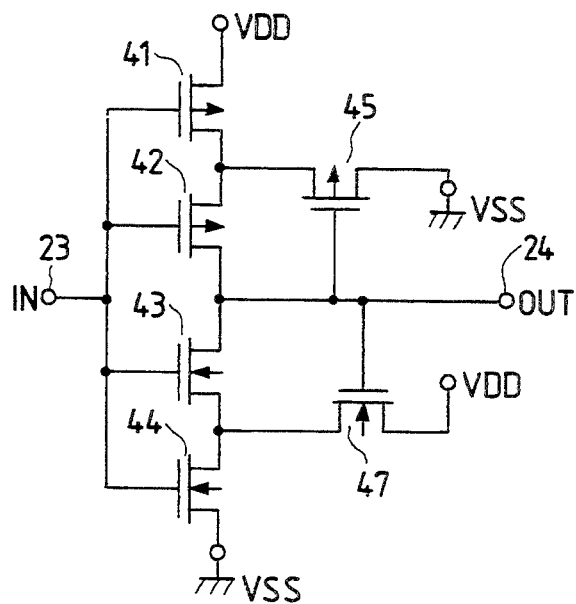
FIG. 8B is a circuit diagram showing an equivalent circuit of the FIG. 7 embodiment when the select signal is high-level.

Next, a description will be given of the case where the select signal SEL is at the high level. In this instance, the select signal SEL=1 is inverted by the inverter 34 (to go to the 0 level) and is then applied to the gate of the p-channel MOSFET 46 to turn it ON, and at the same time, the select signal SEL=1 is applied directly to the gate of the n-channel MOSFET 48 to turn it ON. In consequence, the ground voltage VSS is applied to the drain of the p-channel MOSFET 45 and the power supply voltage VDD to the drain of the p-channel MOSFET 47. Thus, when the select signal SEL is at the H level, the equivalent circuit of the FIG. 7 circuit is such as shown in FIG. 8B. The input and output potential of this equivalent circuit are such as depicted in FIG. 9B.

In the case of the equivalent circuit of FIG. 8A mentioned previously, if a waveform which rises up from the 0 level toward the 1 level is applied to the input IN, then the voltage corresponding to the voltage dividing ratio of the ON resistances of the FETs 41–44 is yielded when the waveform exceeds the voltage $V_{THN}$ (see OUT at the bottom line in FIG. 9B). In the case of the equivalent circuit of FIG. 8B, since the n-channel MOSFET 47 remains in the ON state even after the waveform exceeds the voltage $V_{THN}$, a voltage close to that VDD is being applied to the source of the n-channel MOSFET 43, and consequently, the gate-source voltage of the FET 43 will not exceed the voltage $V_{THN}$ and the FET 43 remains in the OFF state as indicated by OUT at the intermediate line in FIG. 9B. When the input waveform exceeds the voltage $V_{THN}$, the p-channel MOSFETs 41 and 42 are both turned OFF. As the result of this, the voltage of the output OUT drops, and at the same time, the FET 47 is also turned OFF. When the source potential of the FET 43 drops owing to the turning-OFF of the FET 47, the gate-source voltage of the FET 43 exceeds the voltage $V_{THN}$ and the FET 43 is turned ON. Consequently, the 0 level (VSS) is provided to the output OUT.

Similarly, when the waveform at the input IN falls from the voltage VDD toward VSS, the p-channel MOSFET 45 performs exactly the same operation as the above-described operation of the n-channel MOSFET 47 and the output OUT starts to rise at the voltage $V_{THN}$.

AS will be seen from FIGS. 9A and 9B, the waveform in the case of the select signal SEL being at the 1 level (FIG. 9B) is slightly displaced further to the right than in the case of the select signal SEL being at the 0 level (FIG. 9A)—this indicates that the delay time is longer. Needless to say, this increase in the delay time is caused by retarding the operation of the n-channel MOSFET 43 and the p-channel MOSFET 42 as described above.

Figure 10:
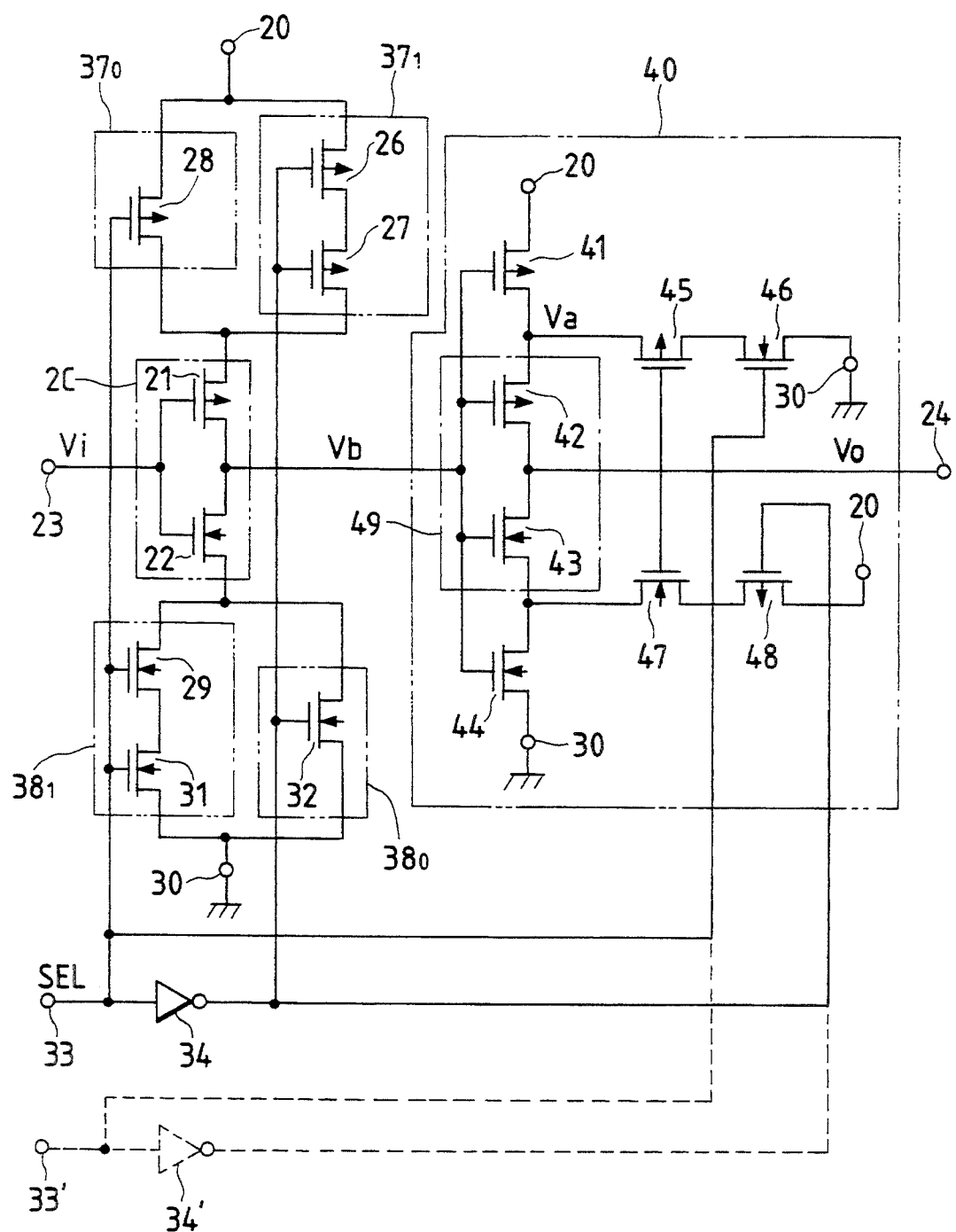
FIG. 10 is a connection diagram illustrating an embodiment which is a combination of the circuits depicted in FIGS. 2 and 7.

In each of the embodiments of FIGS. 2, 5, 6A and 7 the delayed output signal at the output terminal 24 is opposite in polarity to the input signal at the terminal 23. It is therefore evident that a non-inverted delayed output could be obtained by combining an even number of delay circuits of these embodiments. FIG. 10 illustrates an embodiment in which the variable delay circuits of FIGS. 2 and 7 embodiments are connected in cascade. That is, the input terminal 23 of the fine variable delay circuit shown in FIG. 7 is connected to the output terminal 24 of the fine variable delay circuit shown in FIG. 2. In this example, however, control signals for the FETs 46 and 48 in the delay circuit of the succeeding stage are the select signal SEL applied to the preceding stage and its inverted version.

Figure 11:
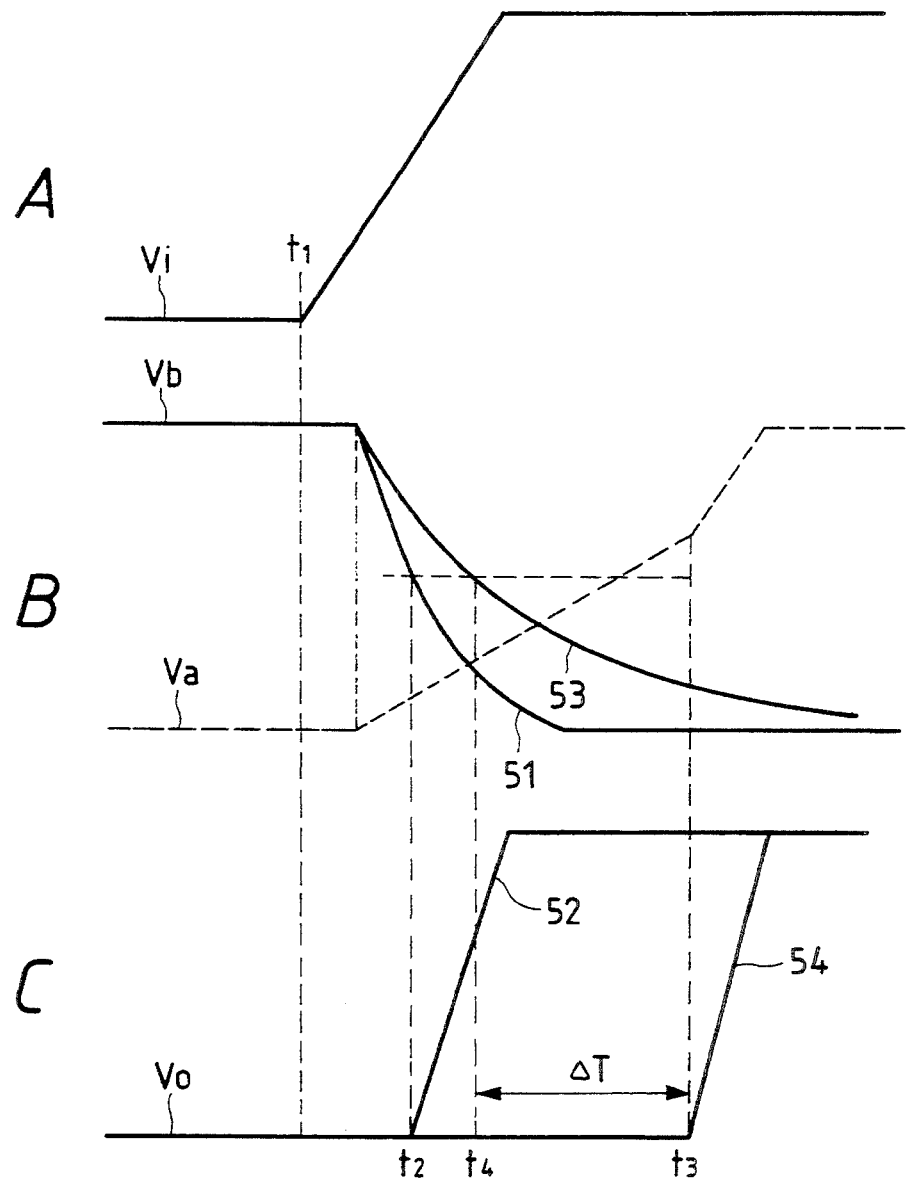
FIG. 11 is a waveform diagram for explaining the operation of the FIG. 10 embodiment.

With such an arrangement, if the select signal SEL at the terminal 33 is low-level when a voltage input signal Vi, which rises up at a time point $t_1$ as shown on Row A in FIG. 11, is applied, the resistance values between the CMOS transistor 2C (FETs 21, 22) and the power supply terminals 20, 30 are small because the FETs 28 and 32 remain ON, and consequently, a voltage Vb which is applied to the input of a CMOS transistor 49 falls relatively quickly as indicated by the curve 51 on Row B in FIG. 11. Since the select signal SEL at the terminal 33 is low-level, the switches 46 and 48 remain OFF and they can be regarded as being left out though connected to the CMOS transistor 49. On this account, assuming that the threshold value of the gate-source voltage of each of the FETs 42 and 43 is, for instance, just intermediate between the high and low levels, a voltage Vo at the output terminal 24 rises up from the low level to the high level at a time point $t_2$ when the voltage Vb (indicated by the curve 51) drops from the high level to the intermediate value, as indicated by the curve 52 on Row C in FIG. 11.

When the select signal SEL at the terminal 33 is high-level, the FETs 26, 27, 29 and 31 are turned ON, and since the resistance values between the CMOS transistor 2C and the power supply terminals 20, 30 are larger than the case where the FETs 28 and 32 are in the ON state, the voltage at the input side of the CMOS transistor 49 drops more gradually than the curve 51 as indicated by the curve 53 on Row B in FIG. 11. Since the switches 46 and 48 are held in the ON state, the connection point of the FET 41 and the CMOS transistor 49 is grounded via the FET 45. Since the output Vo at the output terminal 24 stays low-level prior to the time point $t_1$, the FET 45 is in the ON state and a voltage Va at the connection point of the FETs 42 and 45 remains low. The voltage between the power supply terminals 20 and 30 is provided to the source of the FET 41 after being divided by the impedance of each of the FETs 41, 45 and 46. The voltage Vb drops following the curve 53, and at the same time, the gate-source voltage Va of the FET 41 rises as indicated by the broken line on Row B in FIG. 11. When the input voltage Vb of the CMOS transistor 49 becomes lower than the threshold value of the gate-source voltage of the FET 42, the FET 42 is turned ON, and at this time point $t_3$ the output voltage Vo at the output terminal 24 rises up as indicated by the curve 54 on Row C in FIG. 11. In order that the FET 42 may be turned ON, it is necessary that the input voltage Vb of the CMOS transistor 49 be lower than the half of the high level. In the case where the input voltage Vb of the CMOS transistor 49 varies as indicated by the curve 53, the FET 42 is turned ON at a time point $t_4$ when the input voltage Vb reaches the half of the high level, provided that the FETs 45 and 47 are not employed. Hence, by connecting a delay stage 40 including the CMOS transistor 49 to the illustrated circuit, the delay obtainable when the select signal SEL is high-level can be increased by the difference $\Delta T$ between the time points $t_3$ and $t_4$.

While in the FIG. 10 embodiment the delay is controlled to be either one of two values depending on whether the select signal SEL is high-level or low-level, it is also possible to utilize a construction in which another select signal is applied to a select terminal 33' as indicated by the broken line, the select signal is used to control the gate of the FET 46 and, at the same time, it is inverted by an inverter 34' and the inverted output is used to control the gate of the FET 48. In this instance, the ON-OFF control of the switches $37_0$, $37_1$, $38_0$ and $38_1$ in the preceding delay stage including the CMOS transistor 2C formed by the FETs 21 and 22 and the ON-OFF control of the switches 46 and 48 can be effected separately of each other, by which four values of delay can be set and controlled.

In general, the preceding delay stage including the CMOS transistor 2C in FIG. 10 can be modified to have the construction shown in FIG. 6A—this permits control of a larger number of values of delay. The delay stage 40 may also be provided at the stage preceding the delay circuit including the FETs 21 and 22.

Figure 12A:
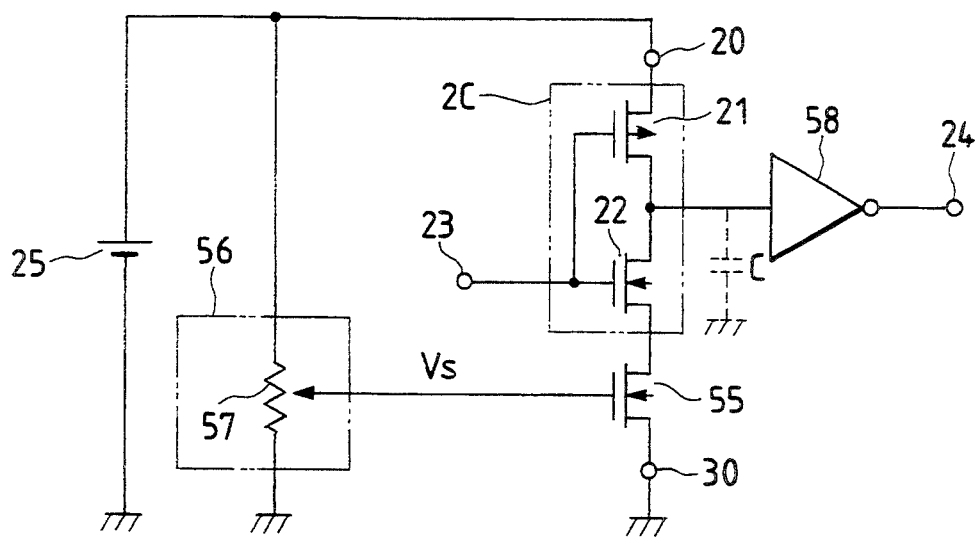
FIG. 12A is a connection diagram illustrating another embodiment of the present invention.

FIG. 12A illustrates an embodiment according to the third aspect of the present invention, in which the parts corresponding to those in the afore-mentioned embodiments are identified by the same reference numerals. A FET 55 of the same conductivity type as that of the n-channel FET 22 is connected in series to the CMOS transistor 2C composed of the p-channel FET 21 and the n-channel FET 22, at the side of the latter in this example, between the both terminals 20 and 30 of the power supply 25. A variable DC voltage source 56 is connected to the gate of the FET 55. Both ends of a variable resistor 57 included in the variable DC voltage source 56 are connected to the both terminals 20 and 30 of the power supply 25 and the output of the variable DC voltage source 56 is used as the control signal Vs to be applied to the gate of the FET 55. The connection point of the FETs 21 and 22, that is, their drains are connected via an inverter 58 to the output terminal 24.

Figure 13:
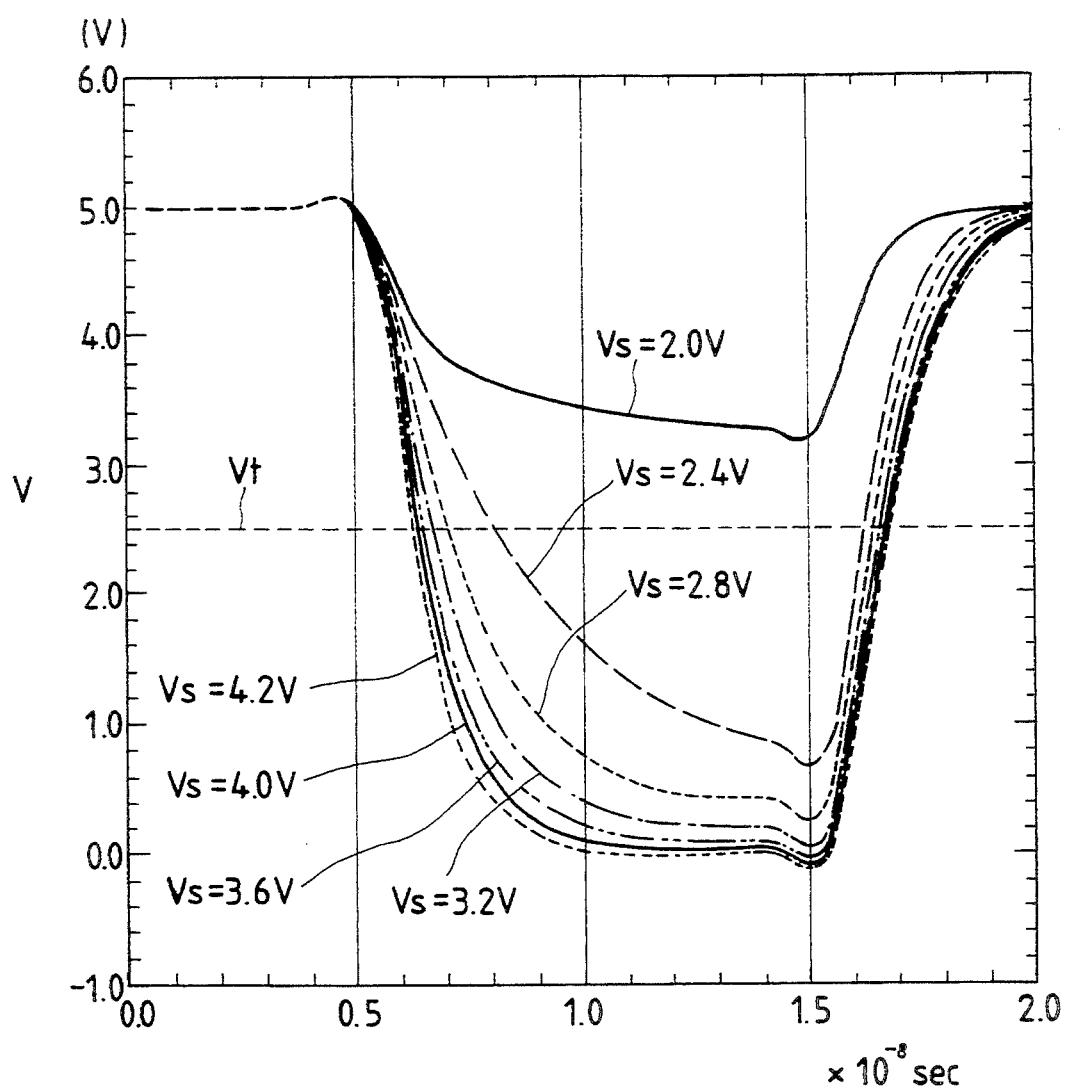
FIG. 13 is a graph showing an input waveform to an inverter 58 with respect to a square input in the FIG. 12A embodiment, with the gate voltage of an FET 55 used as a parameter.

With the above arrangement, when the output of the variable DC voltage source 56 is varied between, for example, 0 and 5 V, the resistance value between the source and drain of the FET 55 varies, that is, its ON resistance varies. This causes an apparent change in the output resistance of the CMOS transistor 2C formed by the FETs 21 and 22. That is, for example, when a positive square voltage is applied to the input terminal 23, the drain output of the FETs 21 and 22, that is, the input voltage of the inverter 58 is such as shown in FIG. 13. In FIG. 13, the parameter used is the value of the output voltage of the variable DC voltage source 56, i.e. the control voltage Vs, varied over the range from 2 to 5 V. When the control voltage Vs is lower than 2.0 V, the ON resistance of the FET 55 is large and the drain output voltage gradually falls and rise, that is, the load capacitance C at the output side is charged and discharged at a remarkably low rate. As the control voltage Vs increases, the ON resistance of the FET 55 decreases, resulting in the drain output voltage falling and rising sharply. Provided that the threshold value of the inverter 58 is 2.5 V, the trailing and leading edges of the drain output voltage vary with the control voltage Vs, that is, the delay time can be controlled in accordance with the control voltage Vs. In this example, the control range is about 2 nanoseconds, and since the control voltage Vs can be produced in smaller units than 0.4 V, the delay time can be changed at intervals of 50 picoseconds, for instance. In other words, the delay control can be effected with a remarkably high resolution.

Figure 12B:
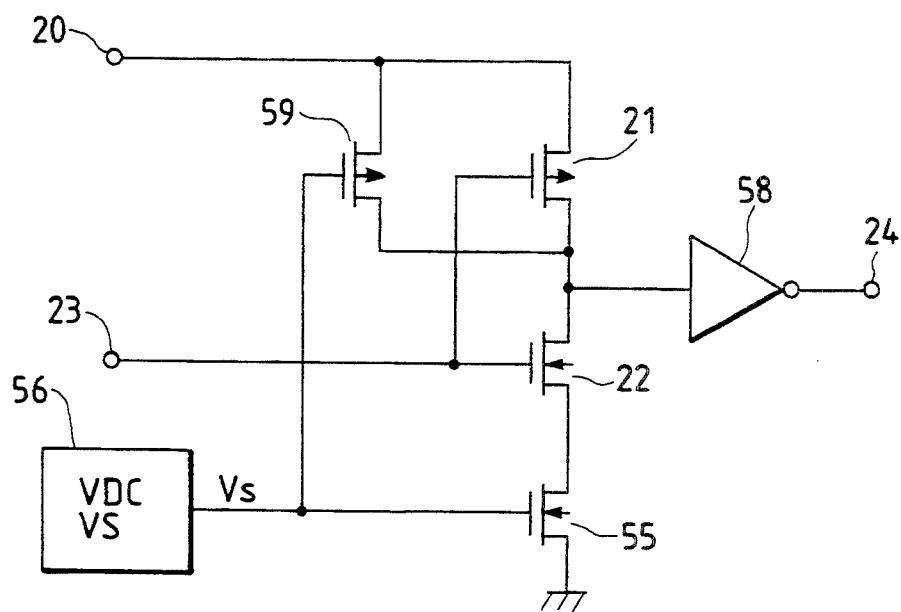
FIG. 12B is a connection diagram of the FIG. 12A embodiment utilizing an NAND gate.

An ordinary gate array is provided with a two-input NAND circuit. Accordingly, such a NAND gate can be used to form a delay circuit similar to that shown in FIG. 12A. That is, as depicted in FIG. 12B, a p-channel FET 59 is connected in parallel to the p-channel FET 21 and the gate of the FET 59 is connected to the output side of the variable DC voltage source 56. The NAND gate which is formed by the FETs 21, 59 and 22 and uses the gates of the FETs 21 and 59 as its inputs. In this NAND gate, as shown in FIG. 12B, the FET 55 is connected in series to the FET 22, and the gate of the FET 59, which forms one of the two inputs, is connected to the variable DC voltage source 56. Since the output voltage Vs of the DC voltage source 56 varies only within a positive range between 0 and 5 V, the FET 59 is always in the OFF state, and hence operates in the same manner as described previously in respect of FIG. 12A. In the circuit arrangements of FIGS. 12A and 12B, the FET 55 which is controlled by the variable DC voltage source 56 may be provided at the side of the FET 22. In this case, a p-channel FET is used as the FET 55 and the variable DC voltage source 56 is controlled to generate a voltage lower than that at the power supply terminal 20.

Thus, according to the third aspect of the present invention, the delay can be controlled with a very small step, for example, with a resolution of 50 picoseconds, by connecting one transistor in series to such a complementary circuit such as a CMOS transistor and by controlling its ON resistance by the variable DC voltage source. Assuming that a delay of 500 picoseconds is obtainable with one gate stage in the conventional structure depicted in FIG. 1A, seven gate delay stages are needed to obtain a maximum variable delay of 3500 picoseconds. If the fixed delay in the selector provided in each stage is 50 picoseconds, then the overall fixed delay becomes 350 picoseconds. If the fixed delay scatters ±20%, then a maximum scatter of the fixed delay is around 100 picoseconds. With such a circuit arrangement, it is impossible to obtain the variable delay circuit having a resolution of 50 picoseconds, but such resolution can easily be accomplished by the circuit arrangement of FIG. 12A.

Figure 14:
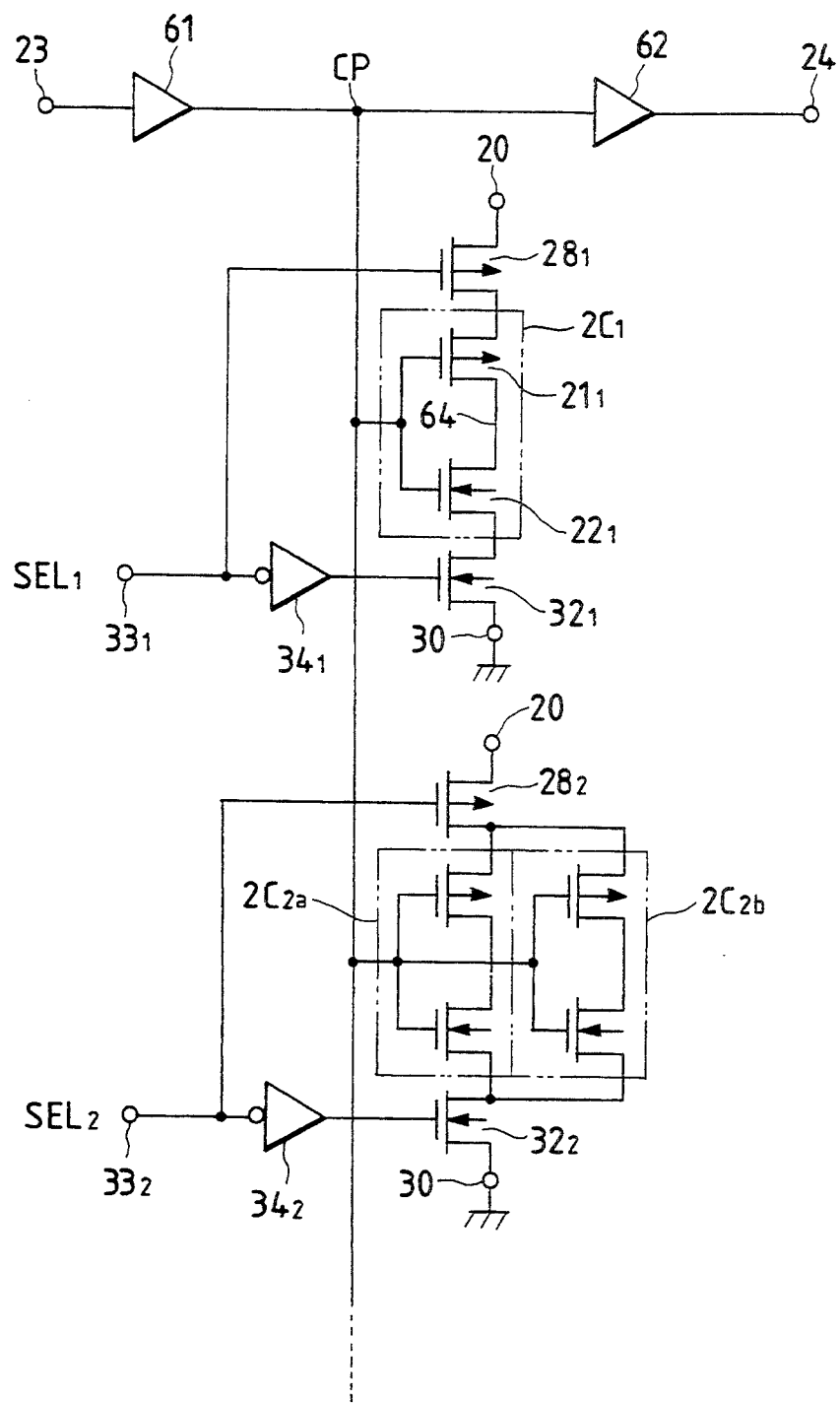
FIG. 14 is a circuit diagram illustrating another embodiment of the present invention.

FIG. 14 illustrates an embodiment according to the fourth aspect of the present invention. The input side of a buffer 61 is connected to the delay input terminal 23. The buffer 61 has an output impedance of a suitable magnitude and outputs logical levels. The output side of the buffer 61 is connected to the input side of a schmidt trigger buffer 62 which has threshold values for the rise and fall of the input signal. The output of the schmidt trigger buffer 62 is connected to the delay output terminal 24. The input side of a CMOS transistor $2C_1$ is connected to the connection point CP of the buffers 61 and 62. The CMOS transistor $2C_1$ has its both ends connected to the power supply terminal 20 and the grounding terminal 30 via a p-channel MOSFET $28_1$ and an n-channel MOSFET $32_1$ serving as switching elements, respectively. In the CMOS transistor $2C_1$ p-channel and n-channel MOSFETs $21_1$ and $22_1$ have their drains connected in series to each other and their gates are connected together and their connection point is connected as the input side to the connection point CP. The FET $21_1$ has its source connected via the switching element $28_1$ to the power supply terminal 20 and the FET $22_1$ has its source grounded via the switching element $32_1$.

With a view to increasing the number of step widths of the variable delay, this embodiment further includes two parallel-connected CMOS transistors $2C_{2a}$ and $2C_{2b}$, which also have the same construction and characteristic as those of the CMOS transistor $2C_1$. Both ends of the two parallel-connected CMOS transistors $2C_{2a}$ and $2C_{2b}$ are connected to the power supply terminals 20 and 30 via a p-channel MOSFET $28_2$ and an n-channel MOSFET $32_2$ serving as switching elements, respectively. The CMOS transistors $2C_{2a}$ and $2C_{2b}$ have their gates connected to the connection point CP.

In order that the switching elements $28_1$ and $32_1$ may be simultaneously controlled to enter the same state by a select signal $SEL_1$ at a select signal input terminal $33_1$, the terminal $33_1$ is connected directly to the gate of the FET serving as the switching element $28_1$ and is connected via an inverter $34_1$ to the gate of the FET forming the switching element $32_1$. Likewise, the switching elements $28_2$ and $32_2$ are simultaneously controlled to enter the same state by a select signal $SEL_2$ at a select signal input terminal $33_2$.

With the above construction, when the select signals $SEL_1$ and $SEL_2$ at the terminals $33_1$ and $33_2$ are both high-level, the switching elements $28_1$, $32_1$, $28_2$ and $32_2$ are all OFF, and the CMOS transistor $2C_1$ side as viewed from the connection point CP is only a mere stray capacitance. Similarly, the CMOS transistor $2C_{2a}$ and $2C_{2b}$ sides as viewed from the connection point CP are only mere stray capacitances. By the Miller effect of these stray capacitances at the connection point CP, the input capacitance of the buffer 62 and the output impedance of the buffer 61 at the time of switching, small steps $ST_1$ and $ST_2$ appear in the rise and fall of the signal waveform at the connection point CP as shown in row A, left column in Table II of FIG. 15. This waveform is shaped by the buffer 62, and as a result, the output waveform at the delay output terminal 24 becomes such as shown in row A, right column in Table II.

In the case where the select signal $SEL_1$ is at the low level and the select signal $SEL_2$ at the high level, the switching elements $28_1$ and $32_1$ are both turned ON and the switching elements $28_2$ and $32_2$ OFF. On this account, the CMOS transistor $2C_1$ operates as an inverter which has its input at the connection point of the gates of the FETs $21_1$ and $22_1$ and its output at the connection point 64 of their drains. While this inverter is in operation, the load capacitance increases near its threshold value by virtue of the Miller effect. Hence, by the Miller effect of the load capacitance and the output impedance of the buffer 61 at the time of its switching, steps $ST_3$ and $ST_4$ larger than those $ST_1$ and $ST_2$ appear in the rise and fall of the waveform at the connection point CP as shown in Row B, left column in Table II of FIG. 15. In consequence, the waveform-shaped output obtainable at the output terminal 24 is delayed behind the corresponding output shown on Row A, right column by the time $\Delta T$, as shown on row B, right column of Table II.

When the select signal $SEL_1$ is high-level and $SEL_2$ low-level, the switching elements $28_1$ and $32_1$ are both turned OFF but those $28_2$ and $32_2$ both ON. Hence, the parallel-connected CMOS transistors $2C_{2a}$ and $2C_{2b}$ both operate as inverters, and by the Miller effect, the load capacitance becomes twice larger than in the case where the CMOS transistor $2C_1$ operates as an inverter. As the result of this, steps $ST_5$ and $ST_6$ larger than $ST_3$ and $ST_4$ appear in the rise and fall of the waveform at the connection point CP as shown on Row C, left column of Table II, and the output waveform at the output terminal 24 is delayed behind the corresponding waveform on Row A by $2\Delta T$.

When the select signals $SEL_1$ and $SEL_2$ are both low-level, the switching elements $28_1$, $32_1$, $28_2$ and $32_2$ are all turned ON. Hence, the CMOS transistors $2C_1$, $2C_{2a}$ and $2C_{2b}$ all operate as inverters. As the result of this, larger steps $ST_7$ and $ST_8$ appear in the rise and fall of the waveform at the connection point CP as shown on Row D, left column in Table II of FIG. 15, and the output waveform at the output terminal 24 is delayed $3\Delta T$ behind the corresponding waveform on Row A. By selecting the combination of the logical level states of the select signals $SEL_1$ and $SEL_2$ as described above, the input signal at the input terminal 23 can be delayed for any one of the four delay times before being provided to the output terminal 24.

By connecting more parallel-connected CMOS transistors, for example, four CMOS transistors, to the connection point CP and controlling them with another select signal, the number of delays can be increased. While in the above CMOS transistors of the same characteristic are used and the delay of a difference linearly in proportion to the number of CMOS transistors which operate as inverters is obtained, it is also possible to substitute, for example, the CMOS transistors $2C_{2a}$ and $2C_{2b}$ with one CMOS transistor of the type that the sizes of the FETs forming it vary in a multiple relationship, for example, one CMOS transistor of a size twice larger than that of the CMOS transistor $2C_1$.

As described above, according to this embodiment, one or more CMOS transistors are connected to the connection point of the buffer and the schmidt trigger buffer and are selectively controlled by the select signal to enter or leave the inverter operating state, by which the delay of the output signal is controlled through utilization of an increase in the load capacitance by the Miller effect bear the threshold value during the inverter operation. Hence, the difference $\Delta T$ between delays can be made small, for example, on the order of picoseconds to tens of picoseconds and the scatter of the difference $\Delta T$ can be reduced; therefore, high resolution can be obtained.

Figure 16:
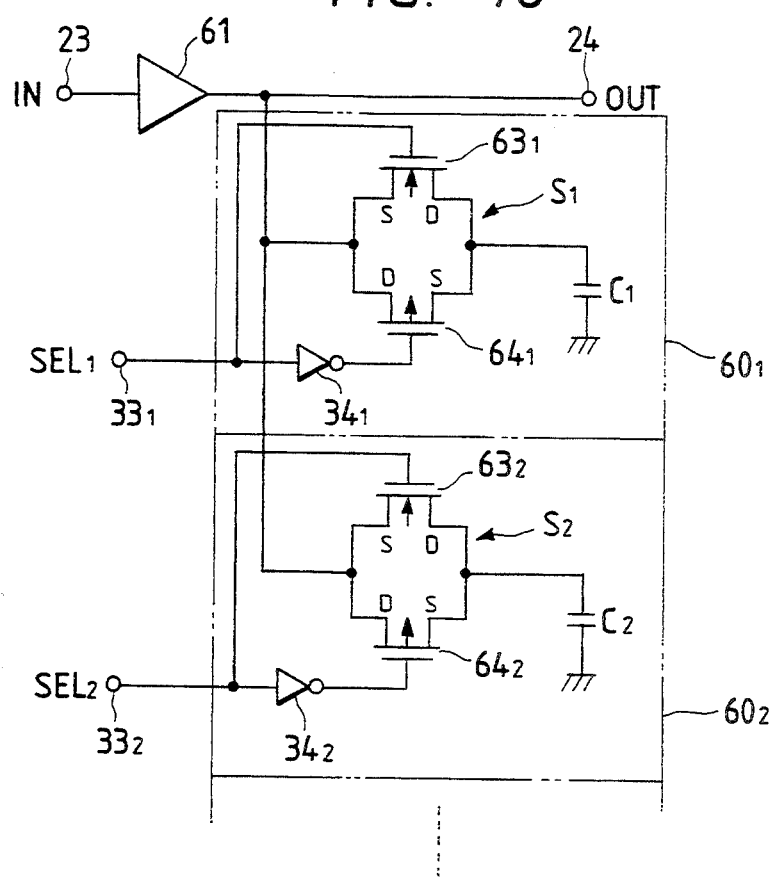
FIG. 16 is a circuit diagram illustrating another embodiment of the fine variable delay circuit according to the present invention.

FIG. 16 illustrates an embodiment of the fine variable delay circuit according to the fifth aspect of the present invention. Reference numeral 61 indicates a buffer formed by a CMOS logic circuit, and the input-output delay between the input terminal 23 and the output terminal 24 is corrected by the fine variable delay circuit of this embodiment. In this embodiment, an n-channel CMOSFET $63_1$ and a p-channel CMOSFET $64_1$ constitute a complementary analog switch $S_1$ in which the source of one of the FETs and the drain of the other are interconnected. The select signal $SEL_1$ at the terminal $33_1$ is applied directly to the gate of the n-channel MOSFET $63_1$ and, at the same time, it is applied to the gate of the p-channel MOSFET $64_1$ via the inverter $34_1$, by which the ON-OFF operation of the complementary analog switch $S_1$ is controlled. The complementary analog switch $S_1$ is connected at one end to the output of the buffer 61 and grounded at the other end via a load capacitance $C_1$. The complementary analog switch $S_1$ and the load capacitance $C_1$ constitute a fine variable delay part $60_1$. Similarly, an n-channel MOSFET $63_2$ and a p-channel MOSFET $64_2$ also form a complementary analog switch $S_2$, which is connected at one end to the output of the buffer 61 and grounded at the other end via a load capacitance $C_2$. The ON-OFF operation of the complementary analog switch $S_2$ is controlled by the select signal $SEL_2$ at the terminal $33_2$. The fine variable delay part $60_1$ formed by the complementary analog switch $S_1$ and the load capacitance $C_1$ and a fine variable delay part $60_2$ formed by the complementary analog switch $S_2$ and the load capacitance $C_2$ are connected in parallel to each other. In general, N such fine variable delay parts, each composed of the complementary analog switch and the load capacitance, are connected in parallel.

A description will be given of the operation of the fine variable delay part $60_1$ which comprises the complementary analog switch $S_1$ and the load capacitance $C_1$.

Figure 17A:
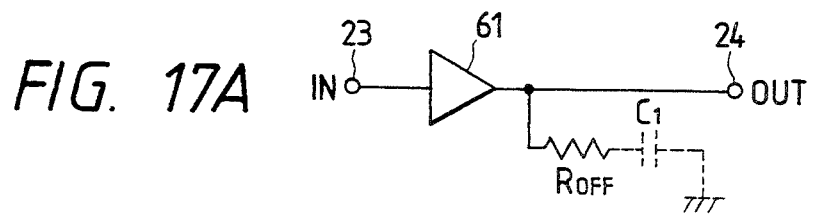
FIG. 17A is a connection diagram showing an equivalent circuit of a buffer 61 and a variable delay part $60_1$ when $SEL_1=0$ in the FIG. 16 embodiment.

When the select signal $SEL_1$ is at the 0-level, it is applied directly to the gate of the n-channel MOSFET $63_1$ and, at the same time, its inverted version obtained by the inverter $34_1$ is applied to the gate of the p-channel MOSFET $64_1$, by which the both FETs are turned OFF. In this instance, the equivalent circuit including the buffer 61 and the fine variable delay part $60_1$ becomes such as shown in FIG. 17A. That is, the OFF resistance $R_{OFF}$ of the complementary analog switch $S_1$ is very high and the load capacitance $C_1$ is essentially disconnected from the output of the buffer 61. Thus, the delay time between the input and output terminals 23 and 24 of the buffer 61 is defined only by the buffer 61 itself.

Figure 17B:
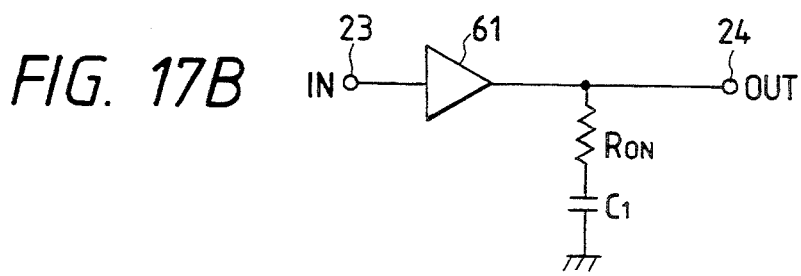
FIG. 17B is a connection diagram showing an equivalent circuit of the buffer 61 and the variable delay part $60_1$ when $SEL_1=1$ in the FIG. 16 embodiment.

When the select signal $SEL_1$ is at the 1-level, it is applied directly to the gate of the n-channel MOSFET $63_1$ and, at the same time, its inverted version 0-level provided by the inverter $34_1$ is applied to the gate of the p-channel MOSFET $64_1$, by which these FETs are both turned ON. In this case, the equivalent circuit including the buffer 61 and the fine variable delay part $60_1$ becomes such as shown in FIG. 17B. That is, the ON resistance $R_{ON}$ between the input and output of the complementary analog switch $S_1$ is very low and the load capacitance $C_1$ is connected via the ON resistance $R_{ON}$ to the output of the buffer 61.

The output voltage $V_{OUT}$, which is provided when a step voltage $V_0$ is applied to the input terminal 23, is expressed by the following equation:

$$V_{OUT}(t) = V_0\{1 - \exp(-t/C_1 R)\} \tag{1}$$

Figure 17C:
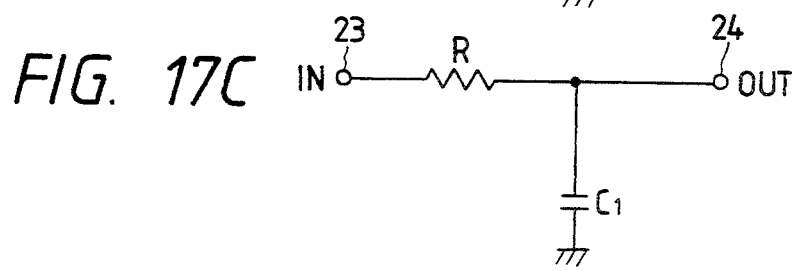
FIG. 17C is a connection diagram showing an equivalent circuit in the case where a buffer output resistance R is sufficiently larger than an ON resistance $R_{ON}$ in FIG. 17B.

Supposed that the output resistance R of the buffer 61 is sufficiently larger than the ON resistance $R_{ON}$, the time, $t=3$, for the output voltage $V_{OUT}$ to reach $V_0/2$ can be obtained from the following equation by referring to FIG. 17C.

$$V_0/2 = V_0\{1 - \exp(-d/C_1 R)\}$$
$$d = -C_1 R \ln(\tfrac{1}{2}) = C_1 R \ln 2 \qquad (2)$$

That is, the output of the buffer 61 is delayed by the time d more than in the case where the select signal $SEL_1$ is at the 0-level (FIG. 17A). As regards the fine variable delay part $60_2$, too, it is possible to control whether to delay the output of the buffer 61 by the select signal $SEL_2$. By controlling the ON-OFF operation of the complementary analog switches $S_1$, $S_2$, ... by the select signals $SEL_1$, $SEL_2$, ... to select the number of load capacitances $C_1$, $C_2$, ... which are connected in parallel to the output of the buffer 61, it is possible to delay the output of the buffer 61 for the period of time in proportion to the sum of the parallel-connected load capacitances.

According to this embodiment, the delay time obtainable with one load capacitance is very short, and the delay time proportional to the number of load capacitances can be set by the select signal.

Figure 18:
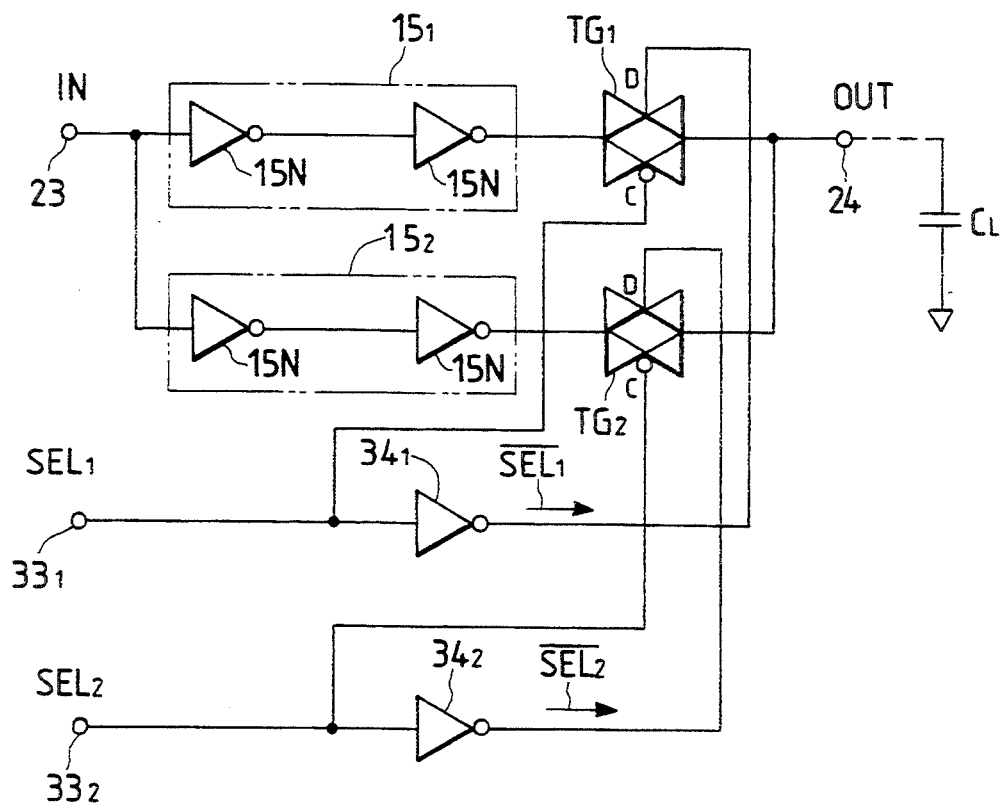
FIG. 18 is a circuit diagram illustrating another embodiment of the present invention.

FIG. 18 illustrates an embodiment according to the sixth aspect of the present invention. In the fine variable delay circuit of this embodiment, a series-parallel circuit, formed by the parallel connection of n series circuits each having a CMOS transmission gate (referred to also as a bilateral gate) $TG_i$ (where $i = 1, 2, \ldots n$, but $n=2$ in FIG. 18) connected to the output side of a CMOS buffer circuit $15_i$, is connected between the input and output terminals 23 and 24. The transmission gates $TG_1$ to $TG_n$ are selectively controlled to be turned ON and OFF, by which the delay time Td between the input and output terminals for the load capacitance $C_L$ connected to the output terminal 24 (the sum of the stray capacitance at the output terminal 24 and the input capacitance of the succeeding stage circuit not shown) is varied.

The CMOS buffer circuit $15_i$ is formed by a series connection of two CMOS inverters 15N. To control terminals C and D of the transmission gate $TG_i$, the select signal $SEL_i$ at the terminal $33_i$ and its inverted version $\overline{SEL}_i$ provided by the CMOS inverter $34_i$ are simultaneously applied.

Figure 19A:
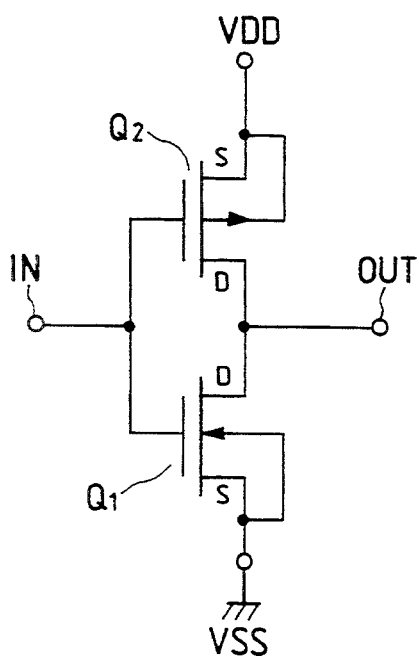
FIG. 19A is a circuit diagram showing in detail a buffer circuit in FIG. 18.

The CMOS inverters 15N and $34_i$ are well-known, each of which is such a complementary transistor circuit as exemplified in FIG. 19A which employs, in combination, an enhancement type n-channel (n-type) MOSFET $Q_1$ and an enhancement type p-channel (p-type) MOSFET $Q_2$. The drains of the FETs $Q_1$ and $Q_2$ are connected together to the output terminal OUT, and the input terminal IN is connected to the gates of the FETs $Q_1$ and $Q_2$. When the input goes high, the FET $Q_1$ is turned ON but the FET $Q_2$ OFF, and consequently, the output goes low. On the other hand, when the input is at the low level, the FET $Q_2$ is turned ON by the FET $Q_1$ OFF, providing a low-level output.

Figure 19B:
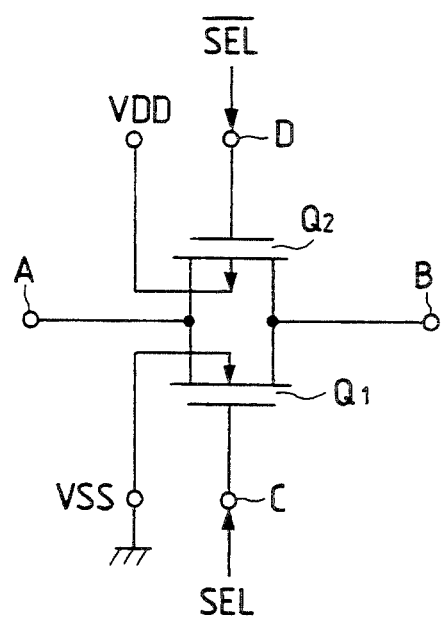
FIG. 19B is a circuit diagram showing in detail a transmission gate in FIG. 18.

As depicted in FIG. 19B, the transmission gate $TG_i$ is formed by an enhancement type n- and p-channel MOSFETs $Q_1$ and $Q_2$ as is the case with the buffer circuit. The path between terminals A and B is a signal transmission line, over which a signal can be passed in both directions. Consequently, the load capacitance $C_L$ in FIG. 18 can be charged and discharged in two directions via the transmission gate TG. The multiplexer 14 in FIG. 1A, used in the past, has a delay of hundreds of picoseconds and its scatter is large. As compared with the conventional multiplexer 14, the delay time of the transmission gate $TG_i$ alone is usually tens of picoseconds, relatively short, and its scatter is also small. The select signal SEL and its inverted version $\overline{SEL}$ are applied to the gates of the FETs $Q_1$ and $Q_2$ from the terminals C and D, respectively. When the select signal SEL is high and the signal $\overline{SEL}$ is low, the transistors $Q_1$ and $Q_2$ are turned ON, but they are both turned OFF when the signal SEL is low and the signal $\overline{SEL}$ is high.

Figure 20A:
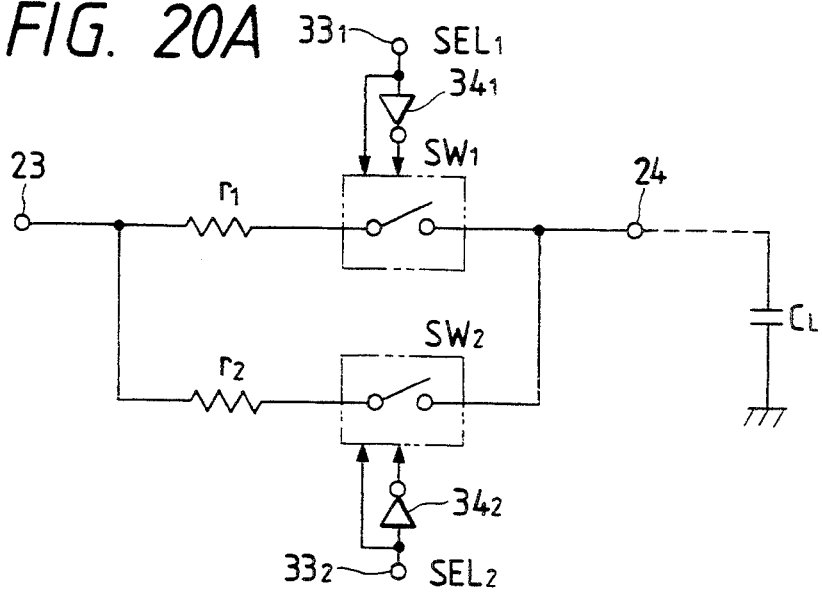
FIG. 20A is an equivalent circuit of the circuit depicted in FIG. 18.

The fine variable delay circuit of FIG. 18 can be expressed by an equivalent circuit depicted in FIG. 20A. A resistor $r_i$ is an equivalent series resistor of a series circuit composed of the buffer circuit $15_i$ and the transmission gate $TG_i$. Depending on whether the select signal $SEL_i$ at the terminal $33_i$ is low or high, a switch $SW_i$ is turned ON or OFF.

In the case where $n=2$ and the equivalent series resistors $r_1$ and $r_2$ are set approximately equal to each other, when the switch $SW_1$ is ON and the switch $SW_2$ OFF, the time constant dependent on the load capacitance $C_L$ and the composite resistance is $\tau = r_1 C_L$, and when the switches $SW_1$ and $SW_2$ are both ON, $\tau = (r_1/2)C_L$, that is, the time constant is reduced by half, as shown in Table III of FIG. 20B. Since the delay time Td between the terminals 23 and 24 is substantially in proportion to the time constant $\tau$, and hence is large in the former case and is reduced by half in the latter case. Incidentally, when the switches are OFF, the output impedance of the delay circuit is high. Usually, a combination of the select signals $SEL_i$ in this case is inhibited, since it makes the logic (L or H) of the output indefinite.

In general, in the case where n stages of delay circuits are connected in parallel, $r_1 \approx r_2 \approx \ldots \approx r_n$ and all switches are turned ON, $\tau = (r_1/n)C_L$ and the delay time Td is 1/n that in the case where the switch of only one stage is turned ON.

When the switch is turned ON in only one stage, $Td \approx 200$ pS, for example. Accordingly, in the case of $n=2$, when the two stages are set ON, the delay time Td is approximately 100 pS. In the case of $n=3$, the delay time Td can be varied to 200, 100 and 67 pS by changing the number of switch turning ON stages to 1, 2 and 3. The minimum variation width in this case is $100 - 67 = 33$ pS. In the case of $n=4$, the delay time Td can similarly be varied to 200, 100, 67 and 50 pS and the minimum variation width is $67 - 50 - 17$ pS.

In the case where $n=2$, the buffer circuit $15_1$ is formed by two series inverters 15N, the buffer circuit $15_2$ is formed by four series inverters 15N and the equivalent series resistances of the series circuits are set to $r_1 < r_2$, the time constant becomes $\tau = r_2 C_L$ (long), $\tau = r_1 C_L$ (medium) and $\tau = r_1 r_2 C_L/(r_1 + r_2)$ (short) according to the combination of the ON and OFF states of the switches $SW_1$ and $SW_2$ as shown in Table IV of FIG. 20C, and hence the delay time Td can be changed to "long," "medium" and "short."

Incidentally, in the case where the output terminal 24 is pulled up to the high or low level via a high resistance, if necessary, the both switches $SW_1$ and $SW_2$ are both in the OFF state in the tables of FIGS. 20B and 20C and the output impedance is high, the output level can be set to the high or low level, and hence can be used.

The combinational circuit of the buffer circuit $15_i$, the transmission gate $TG_i$ and the inverter $34_i$ in FIG. 18 is commonly referred to as a CMOS bus driver logic. Accordingly, this embodiment is constituted by a parallel connection of n CMOS bus driver logic stages.

According to this embodiment, the minimum variation width can be set to a value appreciably smaller than in the past, by suitably selecting the number n of parallel stages of series circuits of the buffer circuit $15_i$ and the transmission gate $TG_i$.

Furthermore, this embodiment employs the transmission gate in place of the multiplexer used in the prior art. The delay time of the transmission gate is as small as tens of picoseconds and its scatter is also considerably small, that is, a small fraction of that in the case of the multiplexer; therefore, the scatter of the delay time of the variable delay circuit can be greatly reduced as compared with the scatter in the prior art.

Figure 21:
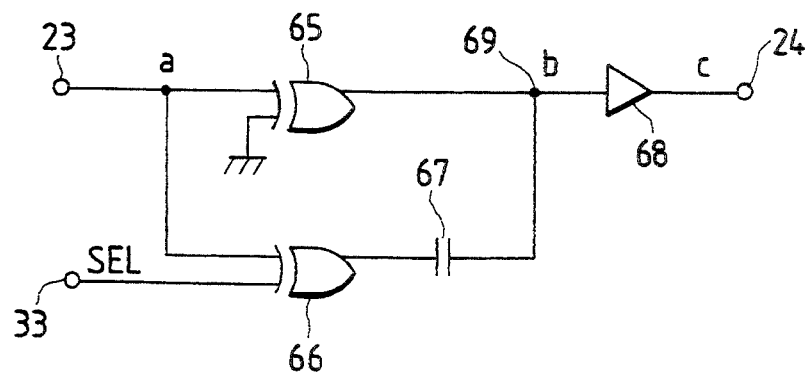
FIG. 21 is a logic circuit diagram illustrating another embodiment of the present invention.

FIG. 21 illustrates an embodiment of the fine variable delay circuit according to the seventh aspect of the present invention. First and second exclusive-OR gates (hereinafter referred to as EXOR gates) 65 and 66 are provided, which are both connected at one input side to the delay input terminal 23, the other input side of the first EXOR gate 65 is grounded and the other input side of the second EXOR gate 66 is connected to the select signal input terminal 33. A capacitor 67 is connected between the output side of the first EXOR gate 65 and the output side of the second EXOR gate 66, and the output side of the first EXOR gate 65 is connected to the delay output terminal 24 via a buffer 68 which outputs logical levels. The buffer 68 has a threshold value and outputs one or the other of binary logical levels, depending on whether the input thereto is above or below the threshold value.

Figure 22A:
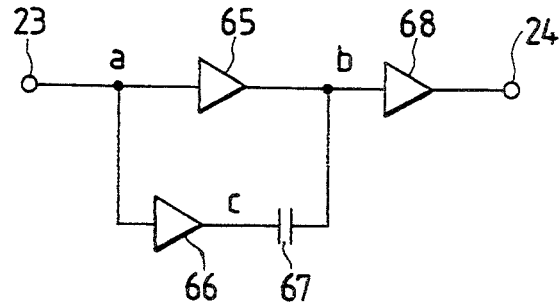
FIG. 22A is an equivalent circuit diagram of the FIG. 21 embodiment when the select signal SEL is "0"
Figure 22B:
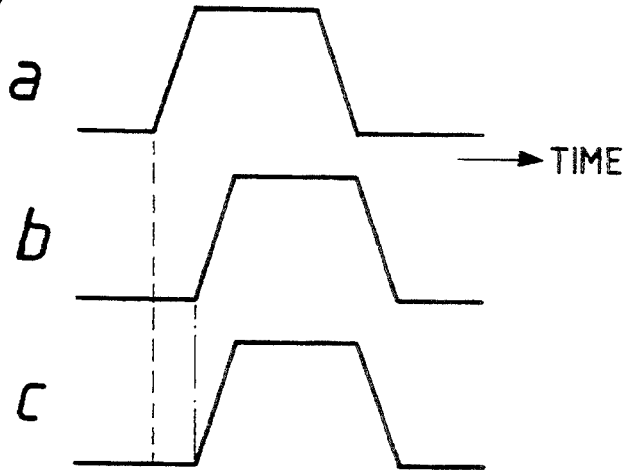
FIG. 22B is a diagram for explaining the operation of the circuit depicted in FIG. 22A.
Figure 22C:
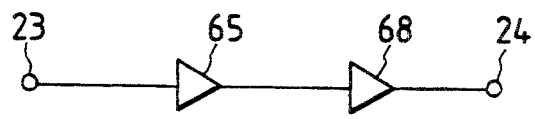
FIG. 22C is an equivalent circuit diagram of the FIG. 22A circuit.

With this arrangement, when the select signal SEL at the select signal input terminal 33 is at the 0-level, the second EXOR gate 66 becomes a non-inverting gate and the circuit of FIG. 21 is equivalent to a circuit shown in FIG. 22A. When a signal of a waveform depicted on Row a in FIG. 22 is applied to the input terminal 23, signals of the same waveform, as shown Rows b and c in FIG. 22B, simultaneously appear at the outputs of the first and second EXOR gates 65 and 66. Consequently, the potential across the capacitor 67 always remains unchanged and no current flows thereinto, hence the impedance of the capacitor 67 can be regarded as infinity. Accordingly, the second EXOR gate 66 can be neglected and the equivalent circuit of FIG. 21 can be expressed as shown in FIG. 22C.

Figure 23A:
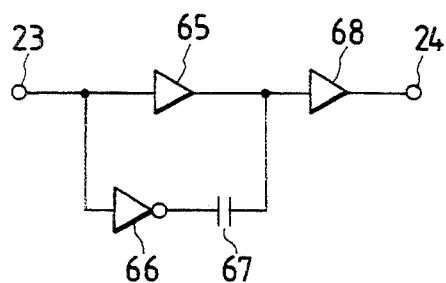
FIG. 23A is an equivalent circuit diagram of the FIG. 21 embodiment when the select signal SEL is "1"
Figure 23B:
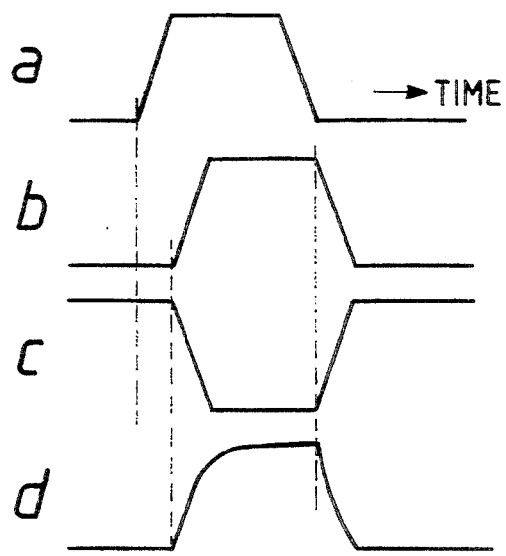
FIG. 23B is a waveform diagram for explaining the operation at respective parts in the circuit depicted in FIG. 23A.
Figure 23C:
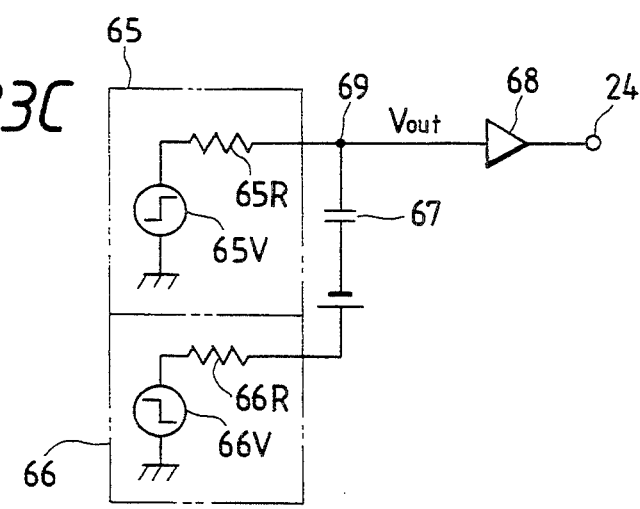
FIG. 23C is an equivalent circuit diagram of the circuit depicted in FIG. 23A.

On the other hand, when the select signal SEL at the select signal input terminal 33 is at the 1-level, the second EXOR gate 65 acts as an inverting gate and the circuit of FIG. 21 can be expressed as shown in FIG. 23A. When a signal of the waveform depicted on Row a in FIG. 23B is applied to the input terminal 23, the output from the first EXOR gate 65 in the case where it is assumed that the second EXOR gate 66 is not provided has the same polarity as the input waveform as shown on Row b in FIG. 23B and the output from the second EXOR gate 66 becomes opposite in polarity to the output depicted on Row b in FIG. 23B, as shown on Row c in FIG. 23B. Representing the first and second EXOR gates 65 and 66 by voltage sources 65V, 66V and output resistances (ON resistances of the gates) 65R, 66R, the circuit of FIG. 23A becomes such an equivalent circuit depicted in FIG. 23C. The following 180° out-of-phase voltages $v_1(t)$ and $v_2(t)$ are output from the voltage sources 65V and 66V.

$$v_1(t) = v_0 f(t), \quad v_2(t) = v_0(1 - f(t))$$

where $f(t) = 0$ for $t \leq 0$, $f(t) = 1$ for $t \leftarrow \infty$, and $0 \leq f(t) \leq 1$.

A voltage $V_{out}(s)$ at the connection point 69 of the first EXOR gate 65 and the capacitor 67 is expressed as follows:

$$V_{out}(s) = V_0 \cdot F(s) - \frac{V_0 F(s) - \{V_0(1/s - F(s)) - V_0/s\}}{(2R + 1/sC)} R \quad (3)$$
$$= \frac{V_0 \cdot F(s)(1/2CR)}{s + 1/(2CR)}$$

where R is the value of each of the output resistances 65R and 66R and C is the capacity of the capacitor 67.

Setting $f(t) = u(t)$ (a unit step pulse), $$v_{out}(t) = V_0 \frac{1/2CR}{s(s + 1/2CR)} \quad (4)$$
$$= V_0\{1 - \exp(-t/2CR)\}$$

The time for the voltage $v_{out}(t)$ to reach the value $V_0/2$ is $2CR\log 2$.

Figure 23D:
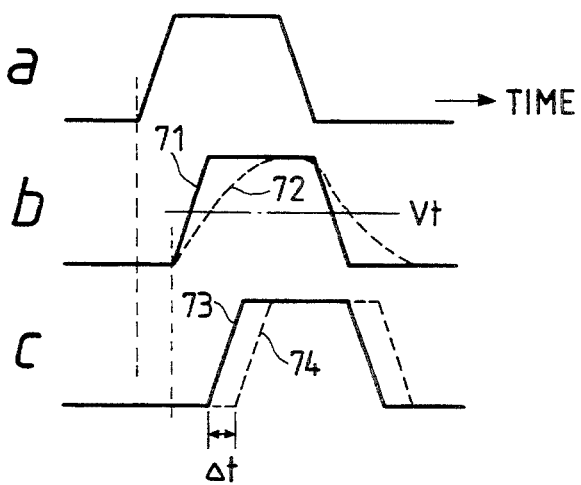
FIG. 23D is a waveform diagram for explaining the operation of the circuit shown in FIG. 23C.

The waveform of the output signal at the connection point 69 is dull in its rise and fall as shown on Row d in FIG. 23B. Consequently, when the signal of the waveform depicted on Row a in FIG. 23D is applied to the delay input terminal 23 in FIG. 23, if the select signal SEL is at the 0-level, the signal at the connection point 69 becomes identical in waveform with the input signal as indicated by the solid line 71 on Row b in FIG. 23D, but if the select signal SEL is at the 1-level, the signal waveform at the connection point 69 becomes dull in its rise and fall as indicated by the broken line 72 on Row b in FIG. 23D. When the threshold level Vt of the buffer 68 is intermediate between the low and high levels as shown on Row b in FIG. 23D, if the select signal SEL is at the 0-level, the output of the buffer 68 becomes such as indicated by the solid line 73 as shown on Row c in FIG. 23D, whereas when the select signal SEL is at the 1-level, the output of the buffer 68 is delayed by $\Delta t = 2CR\log 2$ as indicated by the broken line 74.

It is easy to fabricate the entire circuit structure of FIG. 21 as an integrated circuit and to lessen the influence of wiring, and hence the delay difference $\Delta t$ desired to obtain can easily be accomplished. This delay difference $\Delta t$ can readily be made on the order of 20 to 40 pS, for instance. By connecting in cascade a plurality of such fine variable delay circuits as shown in FIG. 21 and by changing the combination of the select signals for each variable delay circuit to cause the input signal to follow various routes, it is possible to selectively set any one of a plurality of delays which have delay differences $\Delta t$, $2\Delta t$, $3\Delta t$, $4\Delta t$, ... with respect to the minimum delay.

Figure 24A:
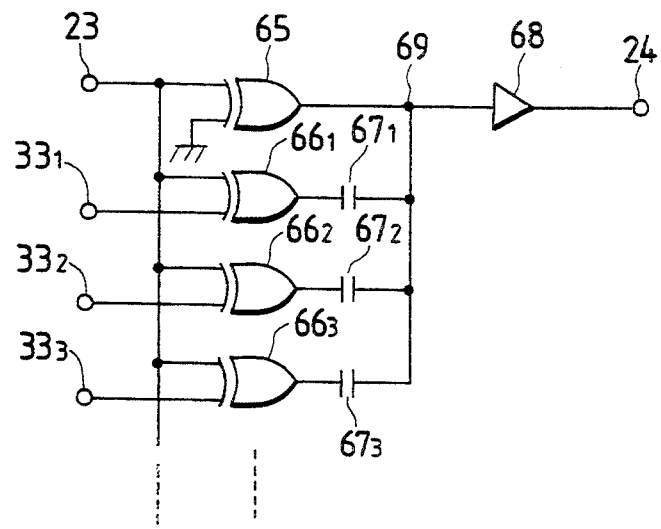
FIG. 24A is a logic circuit diagram illustrating still another embodiment of the present invention.
Figure 24B:
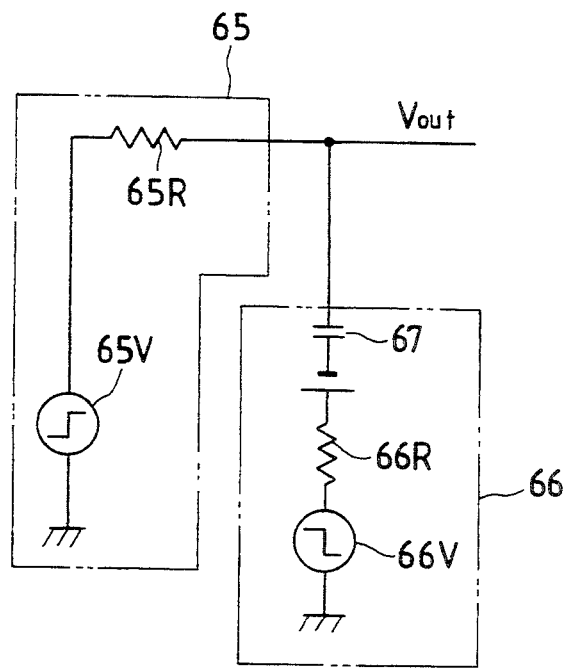
FIG. 24B is an equivalent circuit diagram of the FIG. 24A embodiment.

It is also possible to employ such a construction as shown in FIG. 24A wherein a plurality of second EXOR gates $66_1$, $66_2$, $66_3$, ... are provided and are connected at one input side to the delay input terminal 23 in common to them and connected at the other input side to individual select signal input terminals $33_1$, $33_2$, $33_3$, ..., respectively, and connected at the output side to the output side-of the first EXOR gate 65 via individual capacitors $67_1$, $67_2$, $67_3$, ..., respectively. Assuming that the capacities of the capacitors $67_1$, $67_2$, $67_3$, ... have the same value C, if n of select signals $SEL_1$, SEL$_2$, SEL$_3$, ... at the select signal input terminals 33$_1$, 33$_2$, 33$_3$, ... are at the 1-level, the circuit of FIG. 24A can be expressed by such an equivalent circuit depicted in FIG. 24B as is the case with FIG. 23C. In this instance, since the capacitance 67 is nC and since the output resistance 66R is R/n, the voltage V$_{out}$(s) at the connection point 69 is given by the following equation:

$$V_{out}(s) = V_0 \cdot F(s) - \frac{V_0 F(s) - \{V_0(1/s - F(s)) - V_0/s\}}{(R + R/n + 1/nsC)} R \quad (5)$$

Substitution of V$_1$(s) = V$_0$.F(s), V$_2$(s) = V$_0$(1/s − F(s)), V$_2$(0) = V$_0$, F(s) = 1/s (unit step pulses) into Eq. (5) gives $$V_{out}(s) = V_0 \left[ \frac{\frac{2n}{1+n} \cdot \frac{1}{(1+n)CR}}{s\left(s + \frac{1}{(1+n)CR}\right)} + \frac{\frac{1-n}{1+n}}{s} \right] \quad (6)$$

and $$v_{out}(t) = v_0 \left\{ 1 - \frac{2n}{1+n} \exp\left[ -\frac{1}{(1+n)CR} \right] \right\} \quad (7)$$

The time for the voltage v$_{out}$(t) to reach V$_0$/2 becomes as follows:

$$t = -(n+1)CR\log(n+1)/4n \quad (8)$$

Thus, the delay can be varied monotonically in accordance with the value n.

Figure 1A:
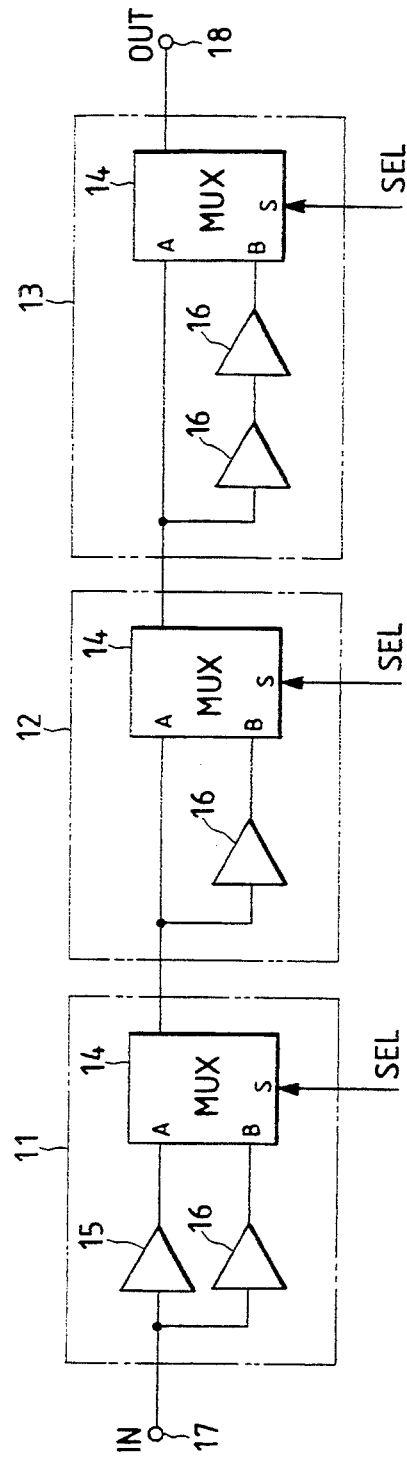
FIG. 1A is block diagram showing a conventional multistage variable delay circuit.

If four second EXOR gates are used in FIG. 24A, then the circuit performs the same function obtainable with two delay stages in the conventional circuit of FIG. 1A. In the above embodiment the first and second EXOR gates 65 and 66 and the buffer 68 are formed by CMOSFETs, for instance.

As described above, according to this embodiment, the delay of the input signal can be changed by the construction in which at least one second EXOR gate is connected in parallel to a first EXOR gate via a capacitor at the output side of the former, a select signal is applied to the other input side of the second EXOR gate and the select signal is made a "0" or "1." It is easy to obtain delays which changes at intervals of 20 to 40 pS, for example; hence a fine variable delay circuit of less scattering delay can be obtained.

Figure 1B:
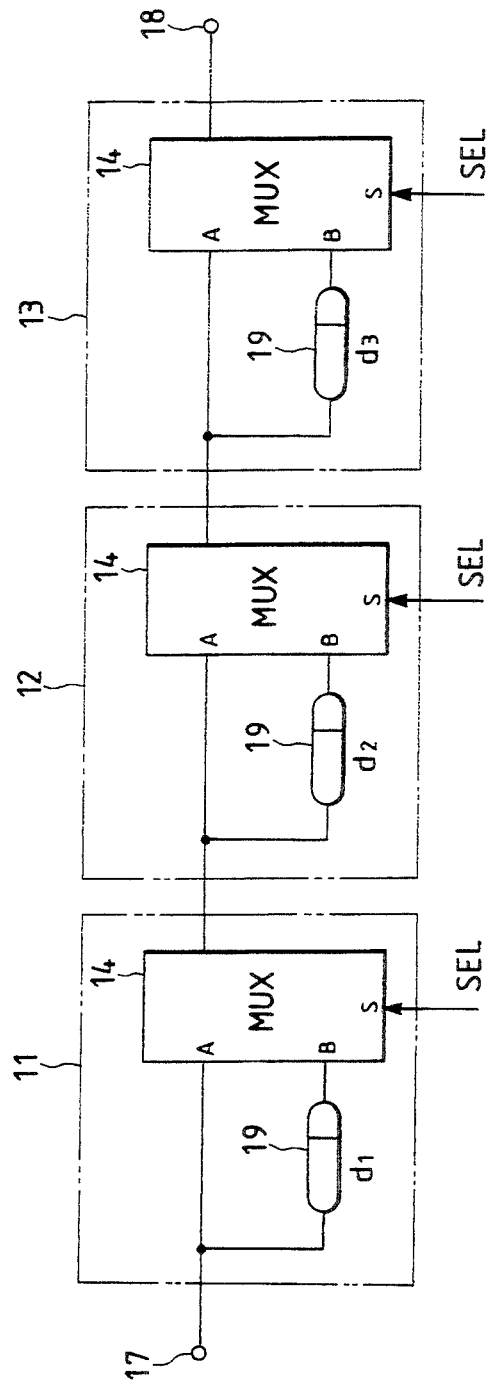
FIG. 1B is a block diagram showing another conventional multistage variable delay circuit.

The above-described embodiments, that is, the circuits shown in FIGS. 2, 5, 6A, 7, 10, 12A, 12B, 14, 16, 21 and 24A may be used as independent variable delay circuit or as individual delay stages in such a multistage connection as shown in FIGS. 1A and 1B. Moreover, FETs are used as transistors in the embodiments but bipolar transistors can be employed.

It will be apparent that many modifications and variations may be effected without departing from the scope of the novel concepts of the present invention.

What is claimed is:

1. A fine variable delay circuit comprising:
   a CMOS transistor having two series-connected FETs of different conductivity types, said two FETs having their gates connected together to a signal input terminal and having their drains connected together to a signal output terminal;
   a first FET connected between one of said two FETs of said CMOS transistor and one end of a power supply and having the same conductivity type as that of said one FET;
   a second FET connected between the other FET of said CMOS transistor and the other end of said power supply and having the same conductivity type as that of said other FET, said first and second FETs having their gates connected to said signal input terminal;
   a third FET connected between the connection point of said CMOS transistor and said first FET and the other end of said power supply and having the same conductivity type as that of said first FET, said third FET having its gate connected to said output end of said CMOS transistor;
   a fourth FET connected between the connection point of said CMOS transistor and said second FET and said one end of said power supply and having the same conductivity as that of said second FET, said fourth FET having its gate connected to said output end of said CMOS transistor;
   a first switch connected in series to said third FET;
   a second switch connected in series to said fourth FET; and
   delay setting means responsive to a select signal to control said gates of said third and fourth FETs, thereby setting a delay.

2. The fine variable delay circuit of claim 1, further comprising
   a CMOS transistor having two series-connected FETs of different conductivity types, said two FETs having their gates connected together to form an input end of said CMOS transistor and having their drains connected to form an output end of said CMOS transistor;
   a first FET connected between one of said two FETs of said CMOS transistor and one end of a power supply and having the same conductivity type as that of said one FET;
   a second FET connected between the other FET of said CMOS transistor and the other end of said power supply and having the same conductivity type as that of said other FET;
   a third FET connected between said CMOS transistor and said first FET and said other end of said power supply and having the same conductivity type as that of said first FET, said third FET having its gate connected to said output end of said CMOS transistor;
   a fourth FET connected between the connection point of said CMOS transistor and said second FET and said one end of said power supply and having the same conductivity type as that of said second FET, said fourth FET having its gate connected to said output end of said CMOS transistor;
   a first switch connected in series to said third FET;
   a second switch connected in series to said fourth FET;
   wherein said input end and output end of said CMOS transistor are connected between said connection point of said first and second transistors and said delay output terminal, and said first and second switches are simultaneously set to the ON or OFF state by said delay setting means.

* * * * *

UNITED STATES PATENT AND TRADEMARK OFFICE
CERTIFICATE OF CORRECTION

PATENT NO. : 5,440,260
DATED : August 8, 1995
INVENTOR(S) : Hayashi et al.

It is certified that error appears in the above-indentified patent and that said Letters Patent is hereby corrected as shown below:

[75] "Inventors" change "Mashuhiro" to --Masuhiro--.
Col. 2, line 38, in the formula before "A" insert --$^1$--.

Col. 18, line 52, change "152" to --$15_2$--.
Col. 20, line 65, change "side-of" to --side of--.

Signed and Sealed this

Twentieth Day of February, 1996

Attest:

BRUCE LEHMAN

*Attesting Officer*    *Commissioner of Patents and Trademarks*